US009508332B2

(12) United States Patent
Scott

(10) Patent No.: US 9,508,332 B2
(45) Date of Patent: Nov. 29, 2016

(54) GUITAR AMPLIFIER

(71) Applicant: 3rd Power Amplification Systems, Franklin, TN (US)

(72) Inventor: James Edward Scott, Franklin, TN (US)

(73) Assignee: 3rd Power Amplification Systems, Franklin, TN (US)

( * ) Notice: Subject to any disclaimer, the term of this patent is extended or adjusted under 35 U.S.C. 154(b) by 307 days.

(21) Appl. No.: 14/160,378

(22) Filed: Jan. 21, 2014

(65) Prior Publication Data

US 2014/0219477 A1   Aug. 7, 2014

Related U.S. Application Data

(63) Continuation of application No. 12/838,102, filed on Jul. 16, 2010, now Pat. No. 8,699,743, and a continuation of application No. 13/560,641, filed on Jul. 27, 2012.

(60) Provisional application No. 61/754,246, filed on Jan. 18, 2013, provisional application No. 61/226,184, filed on Jul. 16, 2009, provisional application No. 61/512,269, filed on Jul. 27, 2011.

(51) Int. Cl.
| G10H 1/46 | (2006.01) |
| H03G 3/06 | (2006.01) |
| H04R 1/40 | (2006.01) |
| H03F 3/183 | (2006.01) |
| H03F 3/21 | (2006.01) |
| H03G 9/06 | (2006.01) |
| H04R 27/00 | (2006.01) |

(52) U.S. Cl.
CPC ............... *G10H 1/46* (2013.01); *H03F 3/183* (2013.01); *H03F 3/211* (2013.01); *H03G 3/06* (2013.01); *H03G 9/06* (2013.01); *H04R 1/403* (2013.01); *H04R 27/00* (2013.01)

(58) Field of Classification Search
None
See application file for complete search history.

(56) References Cited

U.S. PATENT DOCUMENTS

| 4,211,893 A | * | 7/1980 | Smith | ...................... G10H 1/16 330/149 |
| 5,091,700 A | * | 2/1992 | Smith | ...................... G10H 1/06 330/128 |
| 5,793,252 A | * | 8/1998 | Smith | ...................... H03F 3/72 330/118 |
| 8,766,082 B2 | * | 7/2014 | Smith | ...................... H03F 3/28 381/120 |

OTHER PUBLICATIONS

Vox, "Vox Owner's Manual." pp. 1-36. 2004.*
Thebigtwang, "Mea Boogie Simul-Class: What is is & How it works." pp. 1-2. Jan. 2, 2008.*
Mesa Boogie, "Mesa Boogie Mark Five Owner's Manual." pp. 1-70. Jun. 14, 2013. http://www.mesaboogie.com/media/User%20Manuals/MkV_140612.pdf.*

* cited by examiner

*Primary Examiner* — Quoc D Tran
*Assistant Examiner* — Qin Zhu
(74) *Attorney, Agent, or Firm* — Kilpatrick Townsend & Stockton LLP

(57) ABSTRACT

A system and method for a guitar amplifier that overcomes the disadvantages of known amplified speaker enclosures and circuits while providing more effective volume control. A venue switch selects different output ranges for the guitar amplifier. Volume control still adjusts output regardless of venue switch position. In the low-output setting for the venue switch a house or other quiet venue is accommodated with the guitar amplifier that can work in larger venues in the high-output setting.

20 Claims, 48 Drawing Sheets

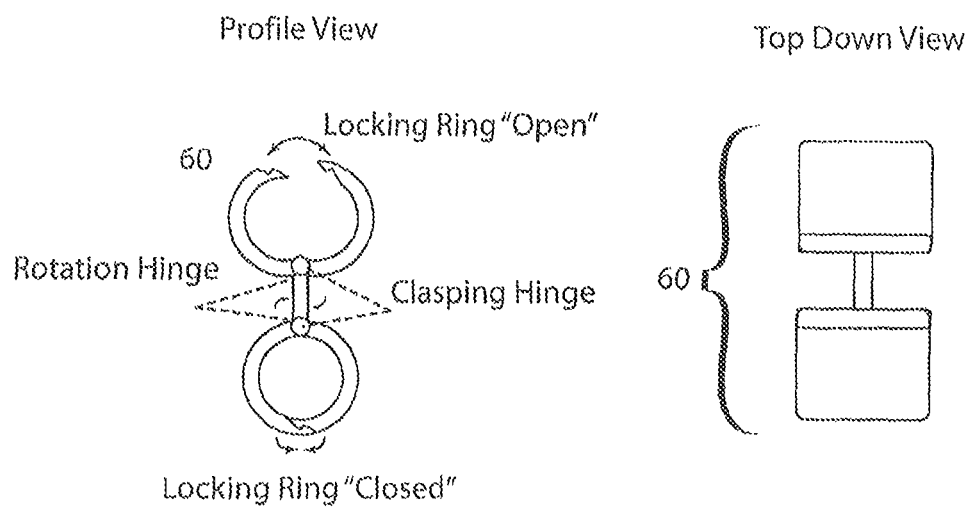
FIG. 6C
FIG. 6D
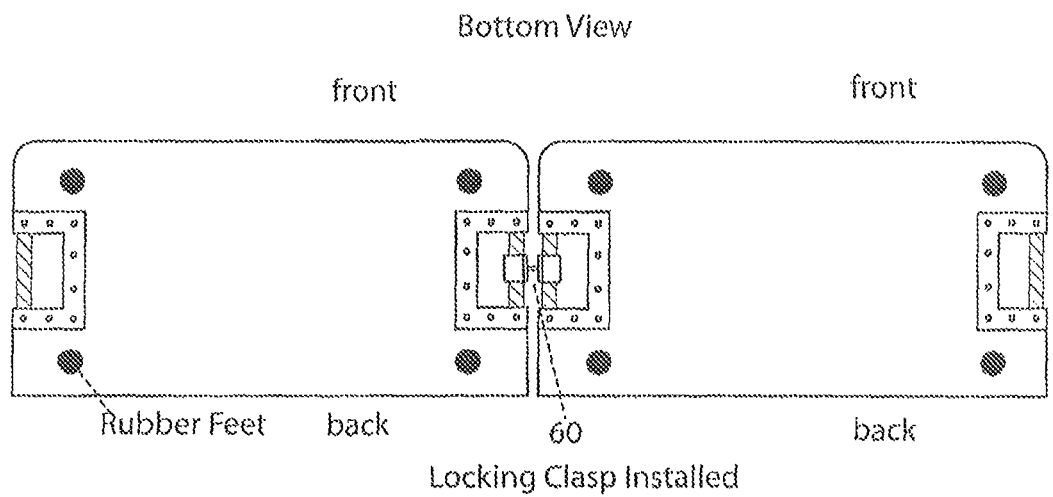
FIG. 6E

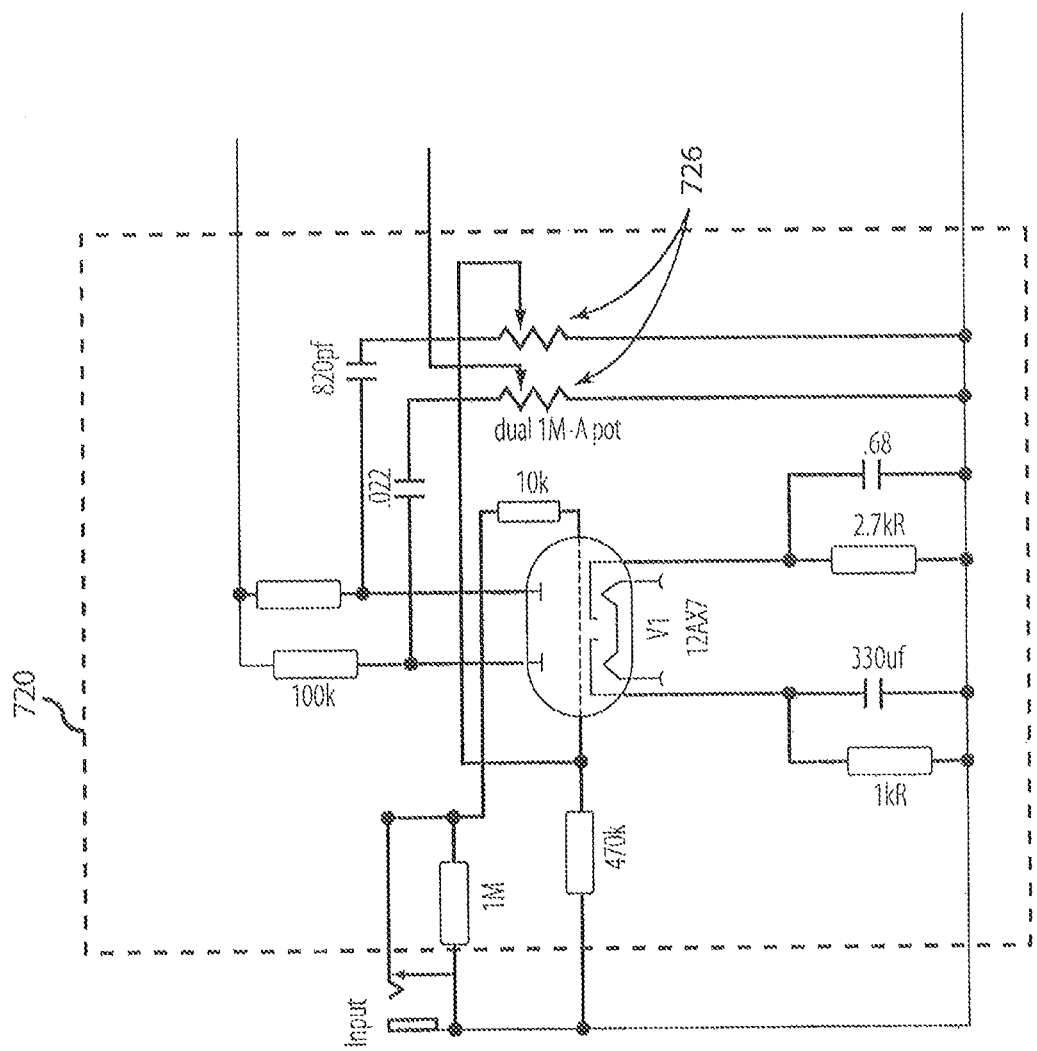

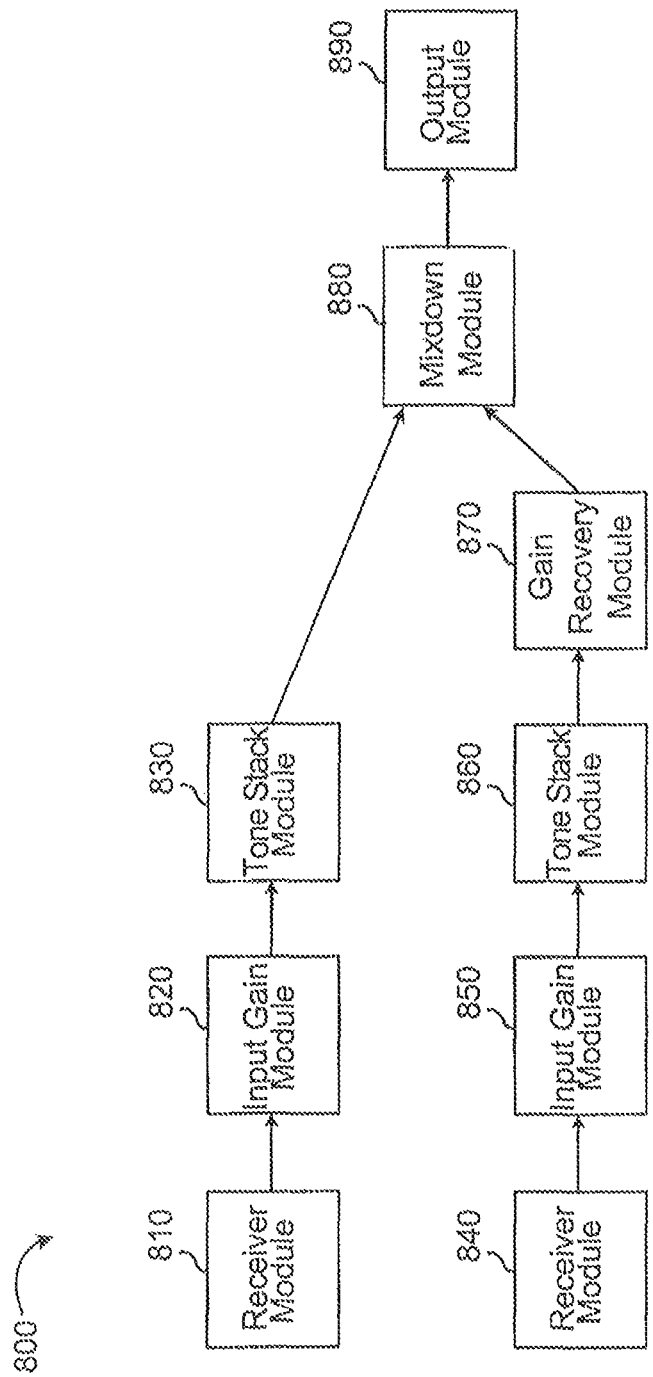

GUITAR AMPLIFIER

CROSS-REFERENCES TO RELATED APPLICATIONS

This application claims benefit of and priority to all of: U.S. Patent Application No. 61/754,246, filed Jan. 18, 2013; U.S. patent application Ser. No. 12/838,102, filed Jul. 16, 2010, which claims benefit of and priority to U.S. Provisional Application No. 61/226,184, filed Jul. 16, 2009; and, U.S. patent application Ser. No. 13/560,641, filed Jul. 27, 2012, which claims benefit of and priority to U.S. Provisional Application No. 61/512,269, filed Jul. 27, 2011. All are incorporated herein by reference for all purposes.

FIELD OF THE INVENTION

This invention relates to an amplified speaker system. More particularly, this invention relates to a speaker system used for the acoustical and electronic amplification of sound.

BACKGROUND OF THE INVENTION

Typically, speaker systems have been used to acoustically and electronically reinforce amplified sound reproduction of musical and other audio performances, Whether by live instrumentation or by playback of recorded material. Such amplifying systems may include speaker enclosures utilizing single or multiple drivers with various baffling and acoustical absorption methodologies to enhance the tone and constructed as stackable rectangular enclosures with or without tuned ports. Conventional rectangular speaker cabinets, especially when loaded with multiple speakers (e.g., the common so-called "4×12" enclosure), may exhibit a narrow beam of sound originally intended to project the sound in a "long throw" manner during live performances. Such amplifying systems may also include electronic circuitry that may enhance the tonal quality (i.e., equalize the sound with tone shaping controls, add desirable harmonic distortion and reverberation effects being common examples) and amplify the signal sufficiently to drive an output device such as a speaker.

Musical instrument performance amplifiers traditionally utilize vacuum tubes as the active circuit elements. Other known musical instrument amplifiers utilize solid-state devices, such as NPN transistors or PNP transistors, field effect transistors, and the like. Further, other known musical instrument amplifiers utilize digital signal processing to model, or mimic, the sonic characteristics of vacuum tube circuitry. It will be appreciated that the methodologies disclosed in the present invention shall include all known or unknown methods of signal amplification and are not limited exclusively to vacuum tube circuit elements.

Examples of known musical instrument amplifiers offered for sale include the "AC30" as sold under the VOX trademark, "Deluxe Reverb" as sold under the FENDER trademark, "2203" as sold under the MARSHALL trademark, and the "Spider Valve" as sold under the LINE6 trademark. Each of the above amplifiers share a common goal in providing enhanced sound quality in an easy to use package. The AC30, Deluxe Reverb and the 2203 share a vacuum tube approach to signal amplification and are considered by knowledgeable musicians to be an important part of the historic sonic fabric of live and recorded popular music. The Spider Valve is unique in that it utilizes digital processing in the preamplifier to mimic the historical sound signatures of the previously discussed amplifiers while relying on vacuum tubes as the active circuit element for driving an output transformer attached to a speaker.

It is known in the art to utilize an amplifier combined with a speaker to produce a desirable electric guitar sound. One such configuration combines these elements in one assembly and known as a "combo" amplifier (i.e., amplifier and speaker or multiples of speakers assembled in one housing). Another configuration divides a system into separate components such as an amplifier (often referred to as an "amp head") for electrically amplifying the signal sufficiently enough to drive a separate acoustical energy transducer, such as a speaker mounted in an enclosure in such a way as to facilitate the radiation of sound wave energy (often referred to as a "speaker cabinet"). Although a variety of speaker sizes exist, the most common speaker size associated with electric guitar features a 12-inch cone due to its inherent favorable sound characteristics in relation to the frequency demands when amplifying electric guitar signals. It will be appreciated that a 12-inch loudspeaker radiates lower frequencies at the outer edges and radiates higher frequencies in the narrow portions around the center of the cone and may produce a narrow beam of bright sound (i.e., sound with emphasized high-frequency content) as perceived by anyone located within this dispersion area. When making use of these components, it is common to stack the amp head on top of the speaker cabinet loaded with a single or multiple 12-inch speakers. Most common among guitar speaker cabinets is the "4×12" (i.e., a quantity of four 12-inch speakers mounted in the same enclosure). Musicians may further describe such a system as a "half stack" (i.e., one amp head and one speaker cabinet) or as a "full stack" (i.e., one amp head and two speaker cabinets). It will be appreciated that when multiple 12-inch speakers are combined, numerous high-frequency sound beams are being transmitted by the system and may result in poor sound quality (i.e., harsh and brittle, comb-filtered and muddy) in several areas on stage as well as in the audience.

Traditionally, guitarists perform live concerts with half-stacks, full-stacks and even multiple stacks of amplifiers. In contrast, modern sound reinforcement, production and staging practices have begun to emphasize cleaner stages (i.e., fewer amplifiers on stage) to both enhance the production (i.e., cleaner sight lines allow for greater use of video screen production effects) and reduce sound pressure levels (SPL) as well as beaming guitar sound waves originating from the stage. The benefits of a lower stage volume may include a reduction in hearing related injuries and an improvement in the overall sound quality as perceived by the audience. In order to facilitate this new practice, innovative wireless in-ear monitoring technologies has been developed by companies such as Shure, Inc. and Sennheiser Electronic Corporation. These wireless inear monitor systems are comprised of a transmitter, portable receiver (i.e., body worn, battery powered pack) and miniature earphones. In practice, a musician employing an inear monitoring system may be able to monitor both his performance and that of the other musicians while controlling the overall mix (i.e., blended of sound of himself in relation to the other musicians) and overall volume via the on-board controls of the portable body-pack receiver. To further enhance the performance of in-ear monitors, guitar amplifiers are occasionally placed below the deck (i.e., off to the side or under the actual stage assembly). Accordingly, there is a need for guitar amplifiers that specifically produce a high-quality sound, at reasonable volumes, with a reduced stage footprint (i.e., the space occupied by the equipment on stage), with a reduced harsh beam of sound, while producing a sound and feel that closely matches the various large-format amplifiers previously relied upon.

Guitarists use instrument amplifiers capable of producing new sounds as well as high-quality approximations of signature vintage amplifier tones. Historically speaking, original vintage equipment was often under powered which led to the practice of turning them up to maximum volume. Under these operating conditions, vintage amplifiers would often distort the signal which guitarists found beneficial to the sound quality. This created a problem for the musician: achieving a distorted sound at lower volumes. Numerous approaches exist and include master volume controls, "dummy" speaker load devices that "soak" up power, power regulators and power diversion circuitry and so on.

The problems associated with all of these various methods include undesirable changes in the sound quality and or the sensitivity or "dynamic feel" of the amplifier, as well as the complexity of user interface. Even something as simple as two knobs often requires the customer to adjust the user interface in difficult-to-replicate ways in order to achieve an acceptable sound.

Each of the various approaches to reducing overall volume have some measure of limited effective operating range such as 10-20%. While it is possible to reduce the perceived volume level in most cases all the way down to "zero" sound the perceived sound and feel of the amplifier worsens at settings beyond this operating range. The flatness in volume reduction is due to the reliance on one "magic-bullet" circuit do all of the work necessary to reduce the volume.

Further, guitar players have become even more conscious to their perceived output power needs and make their amplifier selections based partially on how much power the amplifier is dissipating or is perceived to dissipate in terms of overall sound output. Guitar players categorize amplifiers at 10 to 20 watts, 30 to 40 watts, 50 watts and 100 watts. Guitarists want a 10 watt amp automatically rule out all amps with power in excess of 20 watts—even if those amplifiers feature a master volume control. Excess power is perceived as waste is commonly rejected—especially with today's manufacturers offering a wide range of power options. The excess power designed into the amplifier can distort the signal at lower volumes.

SUMMARY OF INVENTION

In one embodiment, a guitar amplifier that overcomes the disadvantages of known amplified speaker enclosures and circuits while providing more effective sound range is disclosed. A venue switch selects different output ranges for the guitar amplifier. Volume control still adjusts output regardless of venue switch position. In the low-output setting for the venue switch a house or other quiet venue is accommodated with the guitar amplifier that can work in larger venues in the high-output setting.

In another embodiment, a guitar amplifier for boosting a signal from an electric guitar is disclosed. The guitar amplifier includes: an enclosure, an input for receiving the signal from the electric guitar, a plurality of vacuum tubes used to process the signal, a speaker output, a volume knob that adjusts amplitude of the signal for the speaker output, and a venue switch accessible to the user of the guitar amplifier. The venue switch has first position and a second position. In the first position, the volume knob adjusts amplitude in a first range. In the second position, the volume knob adjusts amplitude in a second range different from the first range. The first range has a first maximum amplitude. The second range has a second maximum amplitude. The first maximum amplitude is less than half of the second maximum amplitude.

In one embodiment, a guitar amplifier for processing a signal from a guitar is disclosed. The guitar amplifier includes: an enclosure; an input for receiving the signal from the electric guitar; a plurality of vacuum tubes used to process the signal; a speaker output; a volume knob that adjusts amplitude of the signal for the speaker output; and a venue switch accessible to the user of the guitar amplifier. The venue switch has first position and a second position. In the first position, the volume knob adjusts power in a first range. In the second position, the volume knob adjusts power in a second range different from the first range. The first range has a first maximum power greater than 30 Watts. The second range has a second maximum power less than 20 Watts.

DESCRIPTION OF THE DRAWINGS

FIGS. 6C-6D show views of an embodiment of a locking ring or clasp.

FIG. 6E shows an embodiment of two speaker enclosures connected with a locking ring or clasp attached to respective handle assemblies.

FIG. 20B is a schematic diagram of an embodiment of the gain module of FIG. 20A.

FIG. 24 shows an embodiment of a guitar amplifier block diagram.

FIG. 28A is a schematic diagram of an embodiment of an amplifier circuit.

DETAILED DESCRIPTION OF THE EXEMPLARY EMBODIMENTS

In several exemplary embodiments, the present invention comprises a speaker enclosure. A speaker enclosure can be considered as comprising an enclosure frame, one or more baffle panels, and other components as described herein. Various features of embodiments of the invention will be appreciated by the/following descriptions. The features are described with reference to various embodiments, and should not be construed as limiting the scope of the invention in any way. For example, certain features may only be included in, or provided by, certain embodiments.

Figure 1A:
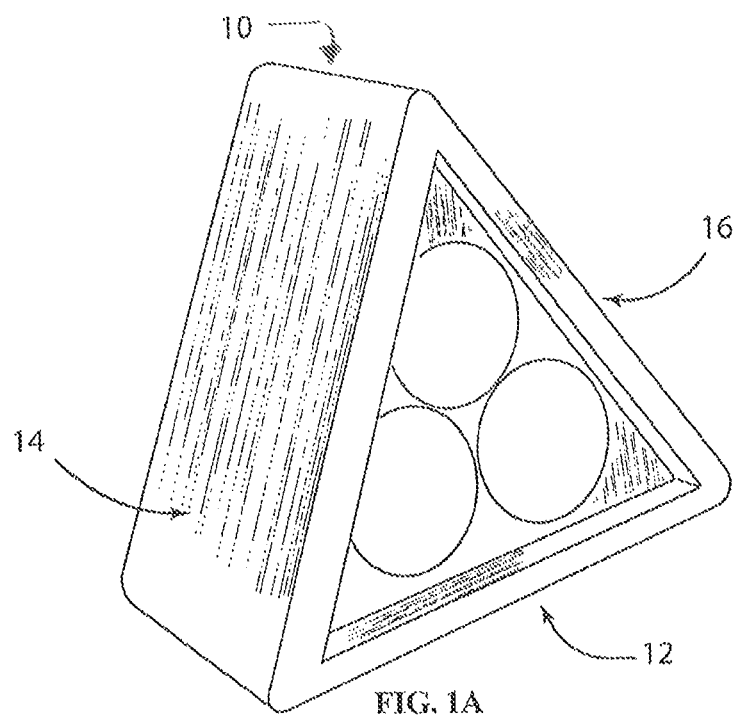
FIGS. 1A-1C show views of an embodiment of a triangular-shaped speaker enclosure.
Figure 1B:
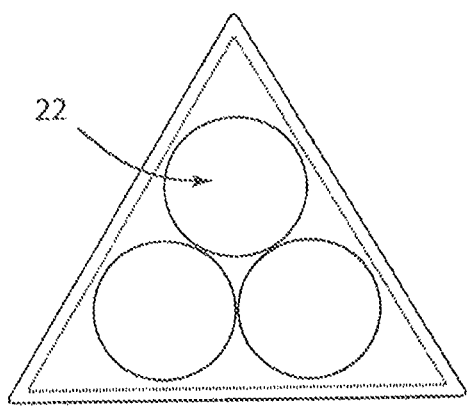
Figure 1C:
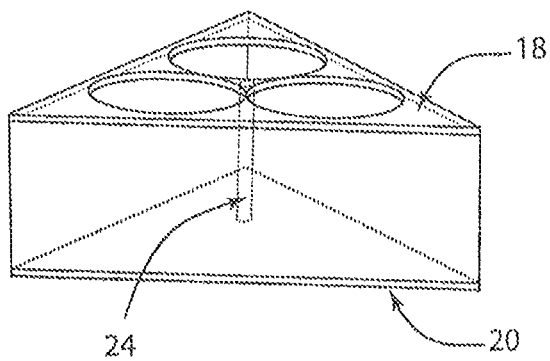
Figure 2A:
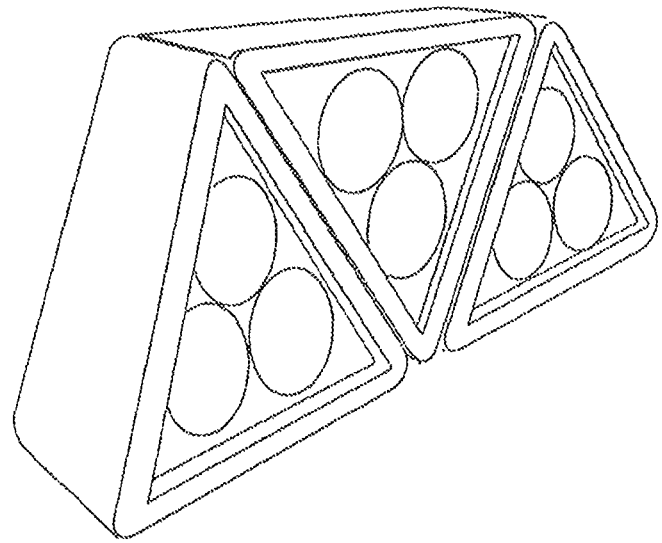
FIGS. 2A-2E show views of multiple triangular-shaped speaker enclosures stacked in a row or pyramid in various embodiments.
Figure 2B:
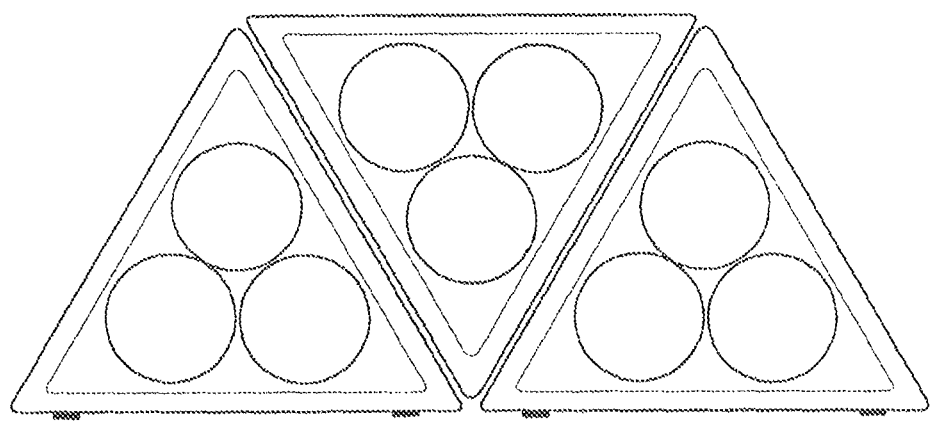
Figure 2C:
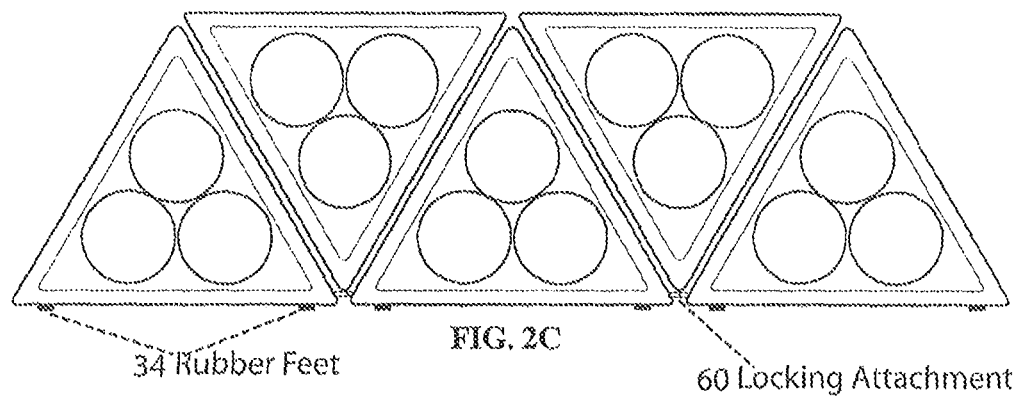
Figure 2D:
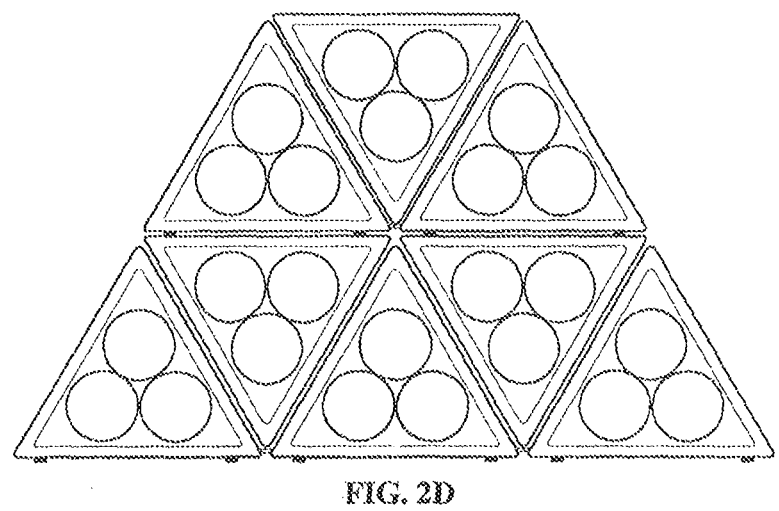
Figure 2E:
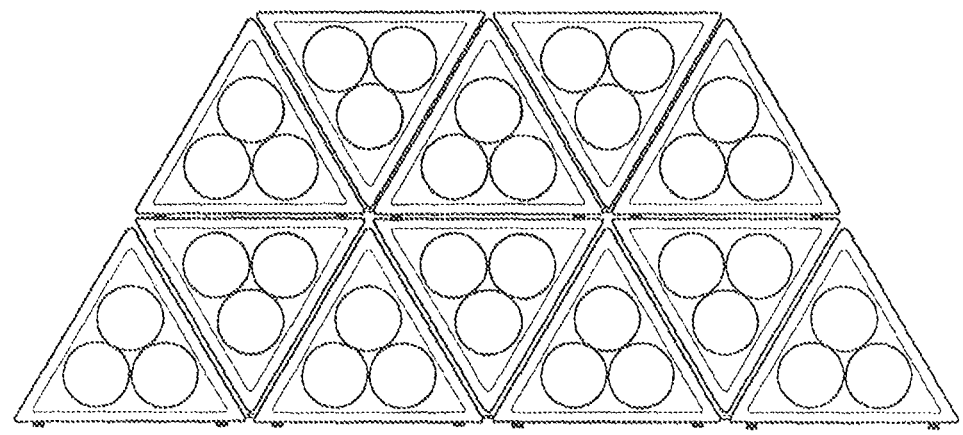

FIGS. 1A-1C show three views of one embodiment comprising a triangular-shaped speaker enclosure 10. The enclosure comprises an enclosure frame comprising a bottom panel 12, a left panel 14, and a right panel 16 configured in a substantially triangular shape. The panels may be contiguous, or separate and joined at their ends. The enclosure may further comprise a front baffle panel 18 or a back baffle panel 20, or both. The front and back baffle panels may be triangular in shape as shown, although other shapes may be used in other embodiments. The front baffle panel may have one or more openings 22 in which to mount one or more loudspeakers. The front and/or back baffle panels may be coupled with the enclosure frame to form a substantially triangular-shaped open back (i.e., no back baffle panel) or closed-back (i.e., with back baffle panel) enclosure.

Extensive experimentation has shown the triangular shape, and particularly the substantially equilateral triangular shape, to manifest desirable acoustical properties in this embodiment. For example, embodiments having triangular baffle boards coupled with a triangular enclosure frame have been shown to reproduce amplified sound with high tonal quality, including a reduction in the "beaming" effect that may be associated with conventional rectangular speaker cabinets across a forward-facing dispersion pattern.

In one embodiment, the triangular enclosure comprises radius members at the vertices of the triangle. The radius members may form substantially 60-degree angles in certain embodiments. Further, the radius members may provide additional features, including structure or material for reinforcing the edges and/or corners of the enclosure (e.g., corner brace 30), structure or material for reducing movement or vibration (e.g., rubberized feet or corners 34), or receivers for a handle member 32, as shown in FIGS. 5A-5C, 6A and 6B.

Various manufacturing processes may be used according to various embodiments. For example, components of the enclosure may be manufactured with any useful material that may or may not be acoustically active, including, but not limited to, wood, particle board, plywood, composite, plastic, metal, or similar material. The enclosure may be formed using panels or one or more contiguous pieces. In one embodiment, the enclosure frame (i.e., bottom, left and right panels) and front baffle panel are formed in a single piece by milling and shaping a solid block of wood. In another embodiment, the enclosure frame is formed by extruding metal or plastic into the triangle shape.

In several embodiments, one or more posts 24 are coupled between the front and back baffle panels 18, 20. In one embodiment, a single center post 24 is coupled at the planar center of each baffle panels as shown in FIG. 1C. The post(s) may be configured to mitigate or eliminate any phase differences between the baffle panel vibrations. For example, it may be undesirable to allow the front baffle panel 18 and the back baffle panel 20 to ever vibrate out of phase with respect to each other.

Other exemplary embodiments comprise substantially triangular ports 40 on the front or back baffle panels, as shown in FIGS. 7A-7F. The triangular port shape, and particularly the substantially equilateral triangular port shape, manifests desirable sound reproduction properties in one embodiment. For example, embodiments having triangular speaker chambers as defined by a triangular enclosure frame, or triangular enclosure subframe (e.g., triangular speaker chamber(s) contained inside of a rectangular exterior enclosure shell)

have been shown to reproduce amplified sound with enhanced frequency response, including an extension of low frequencies, producing a perceptibly fuller sound throughout a 360 degree dispersion pattern in one embodiment.

Figure 8A:
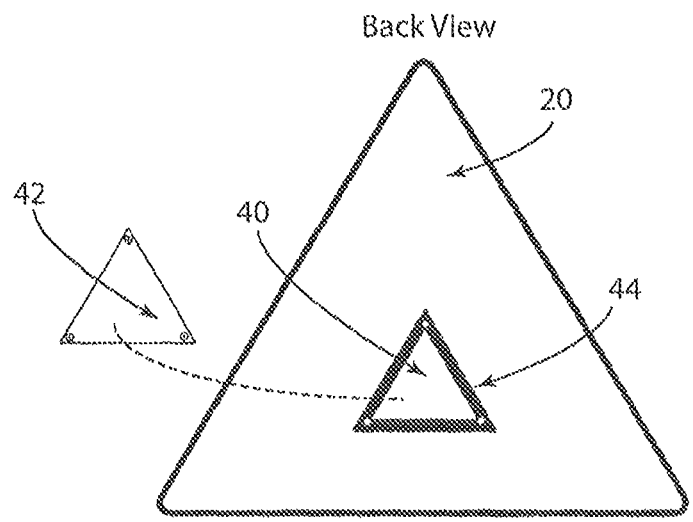
FIGS. 8A-8B shows side and back views of an embodiment of a triangular port with lid device.
Figure 8B:
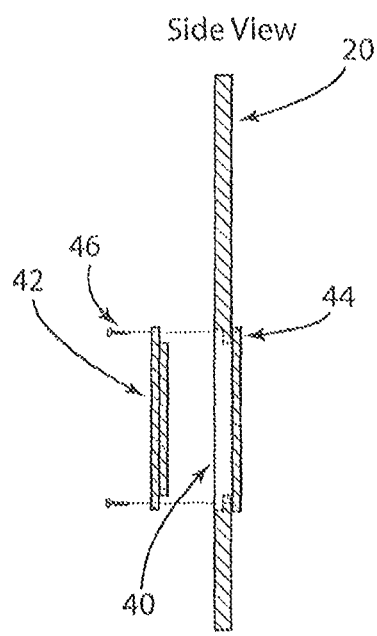
Figure 9A:
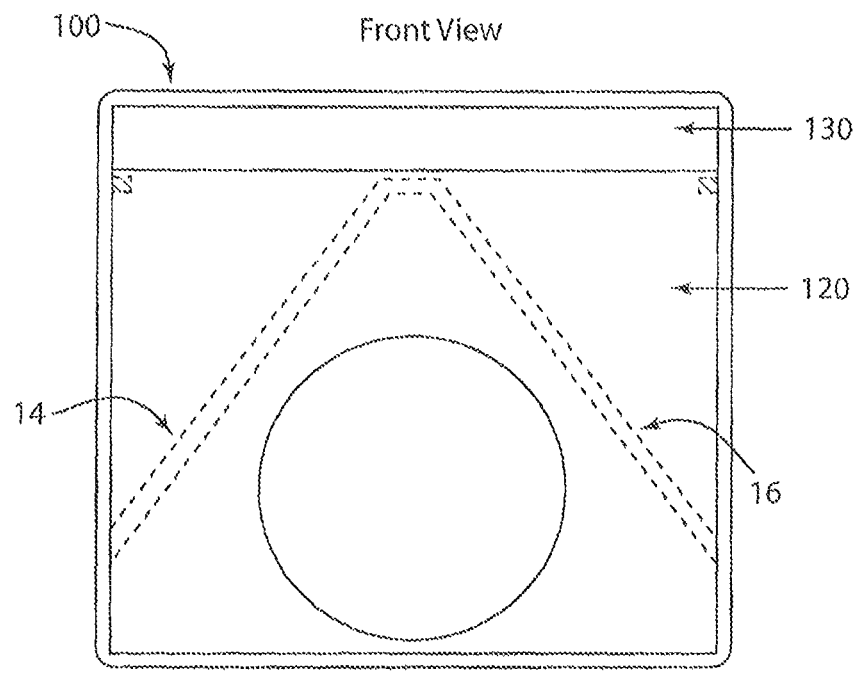
FIGS. 9A-9D show views of an embodiment of a speaker enclosure with interior isolated space(s) for an amplifier, tubes, transformers, or other apparatus.
Figure 9B:
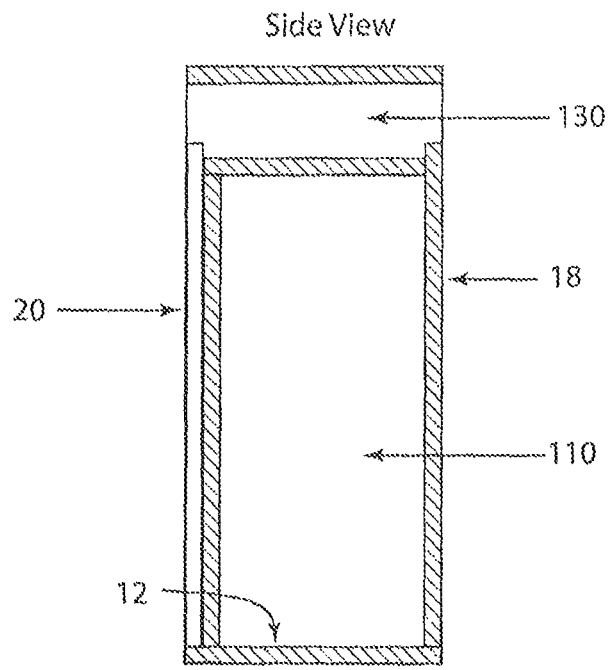
Figure 9C:
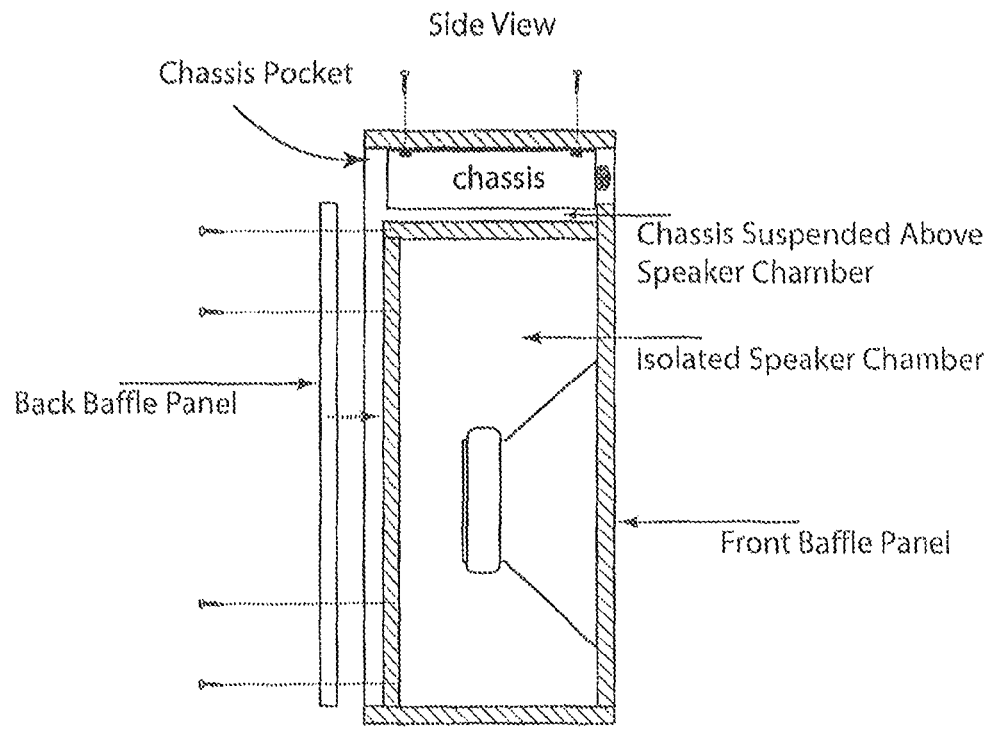
Figure 9D:
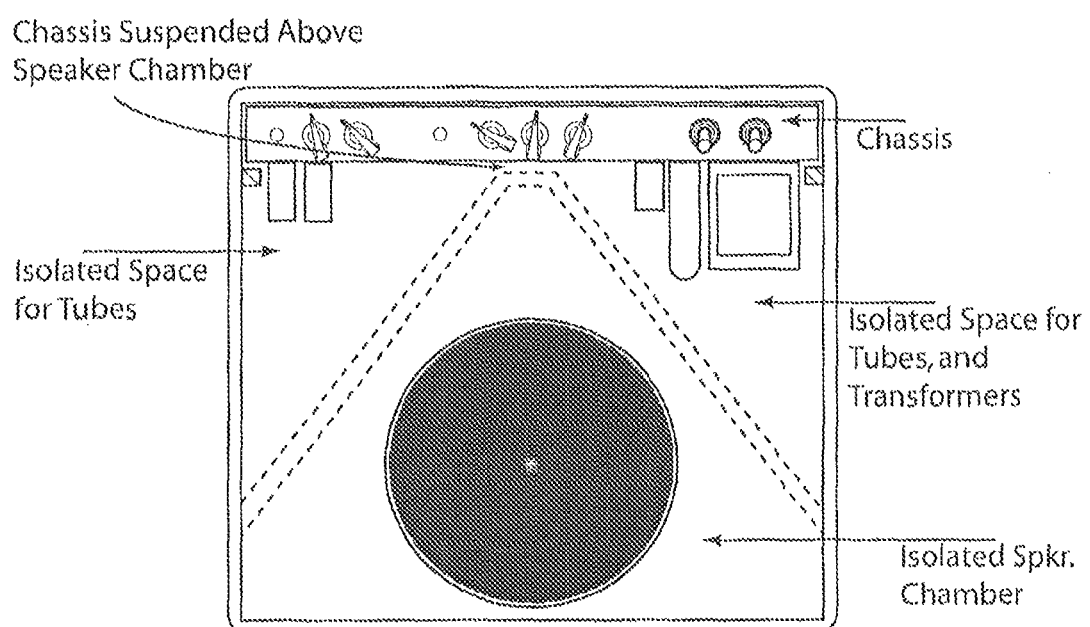
Figure 9E:
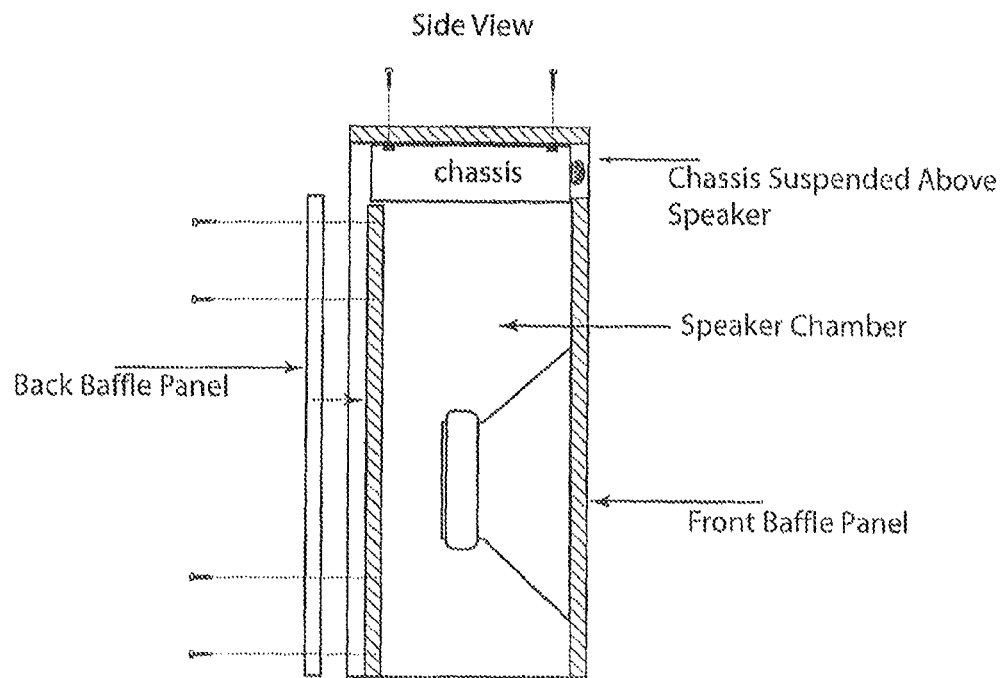
FIGS. 9E-9F show views of an alternative embodiment of a trapezoidal speaker enclosure containing all electronic components.
Figure 9F:
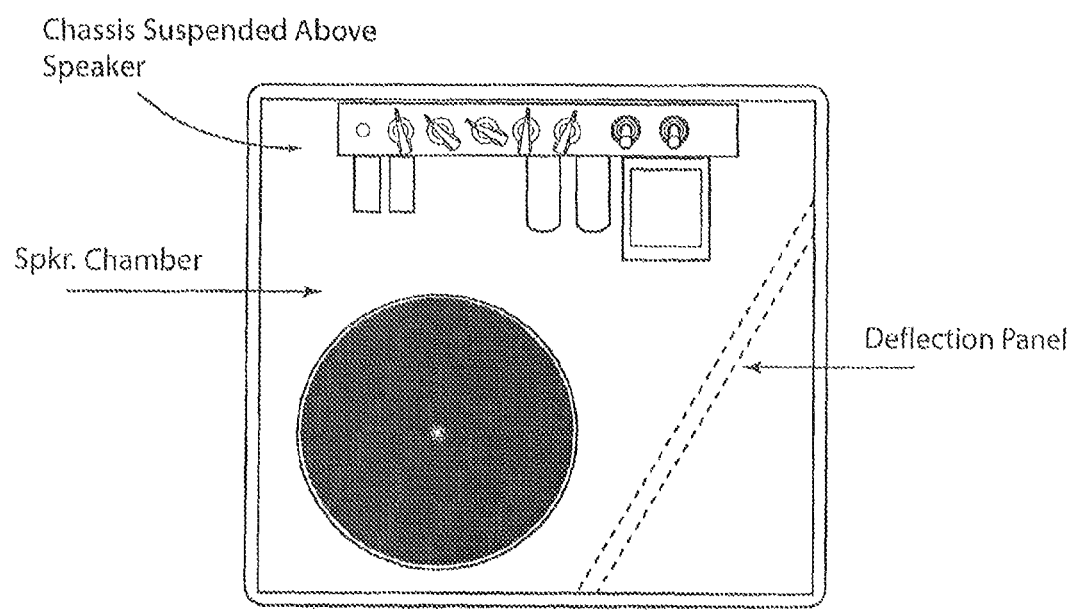

In one embodiment, the triangular port 40 is manufactured with an internal support structure 44 allowing the port to receive a triangular lid 42 as a method of attaching the lid and closing, or sealing, the port vent as shown in FIGS. 8A and 8B. Various attachment methods may be used. In one embodiment, the port lid may be attached to the back baffle panel by screws 46. In another embodiment, the port lid may be attached by materials that present substantial friction, grip, or locking properties, such as, but not limited to, Velcro™, or molded components that snap securely into a locked position, or machined levers and gears that can be manipulated from a locked state and released for detachment.

Figure 3A:
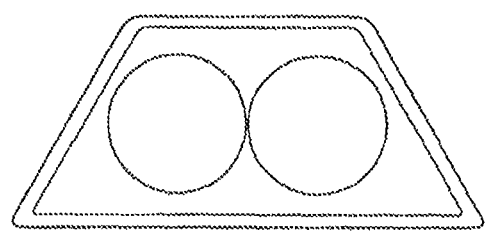
FIG. 3A shows an embodiment of a trapezoidal-shaped speaker enclosure.
Figure 3B:
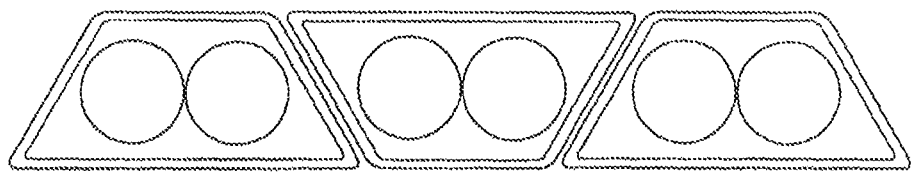
FIGS. 3B-3C show views of triangular-shaped and trapezoidal-shaped speaker enclosures stacked in a row for various embodiments.
Figure 3C:
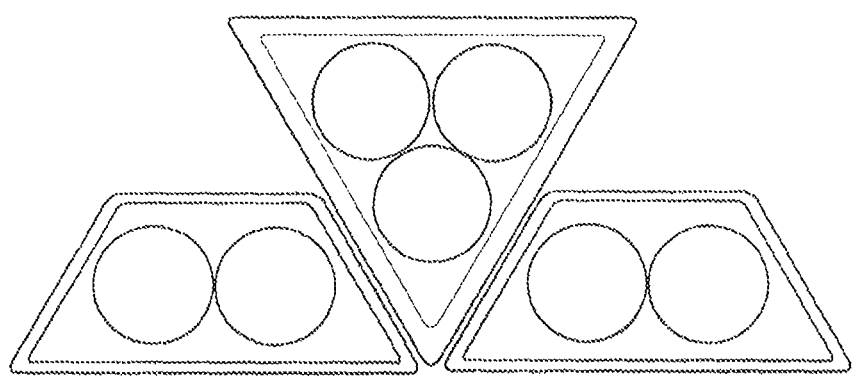

Various embodiments of the enclosure may use shapes other than an equilateral triangle. For example, the enclosure may take the form of a right triangle, an isosceles triangle, a trapezoid, a parallelogram, or other similar form. FIG. 3A shows an exemplary embodiment of an enclosure that is substantially trapezoidal in shape. This shape may allow stacking of one or more additional components on a top panel of the enclosure. For example, an amplifier, another speaker, or other apparatus may be stacked on the flat top panel. It is worth noting that, while other shapes may be used without departing from the scope of the invention, certain features may be realized using a substantially symmetric triangular shape.

Figure 5A:
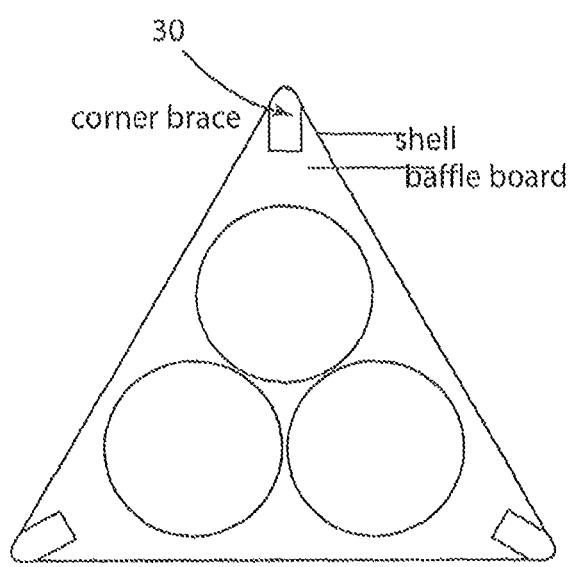
FIGS. 5A-5C show views of an embodiment of a triangular-shaped speaker enclosure with corner braces and handles.
Figure 5B:
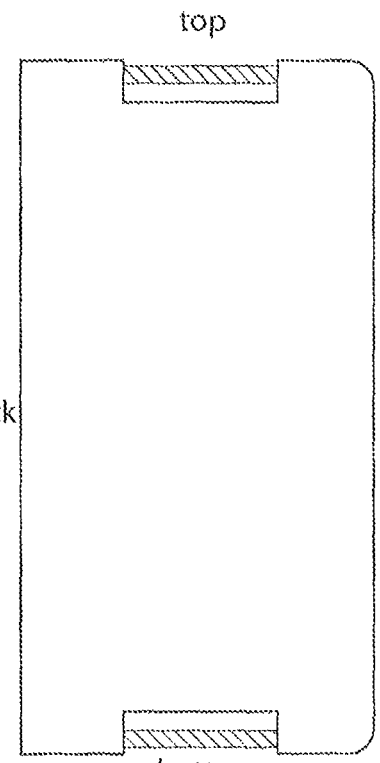
Figure 5C:
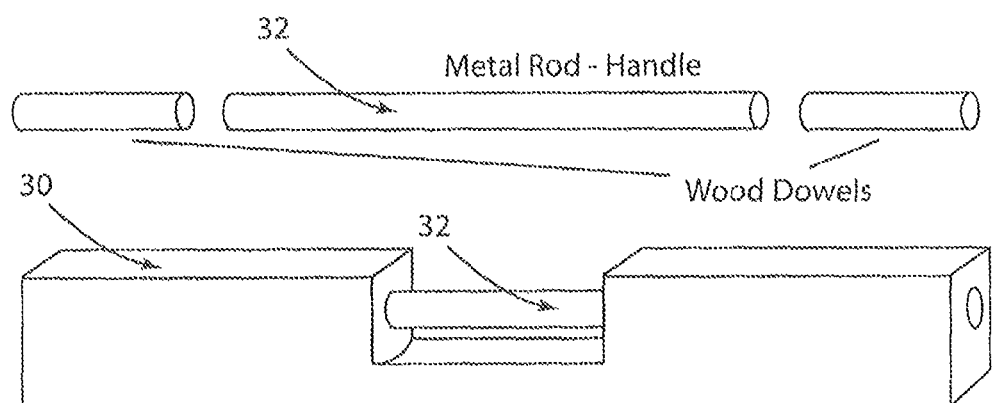

For example, the enclosure may be shaped to facilitate stacking of multiple enclosures, as shown in FIGS. 2A-2E, 3B and 3C. Enclosures with different shapes may be stacked together (e.g., triangular enclosure inverted between two trapezoidal enclosures, as shown in FIG. 5C). It will be appreciated that multiple speaker enclosures may be stacked and/or secured together in any compatible geometric shape, including, for example, a "pyramid" sized to satisfy a large-scale speaker system requirement for sufficiently reproducing multiple sound signals within a particular location (e.g., a musical performance stage).

Figure 6A:
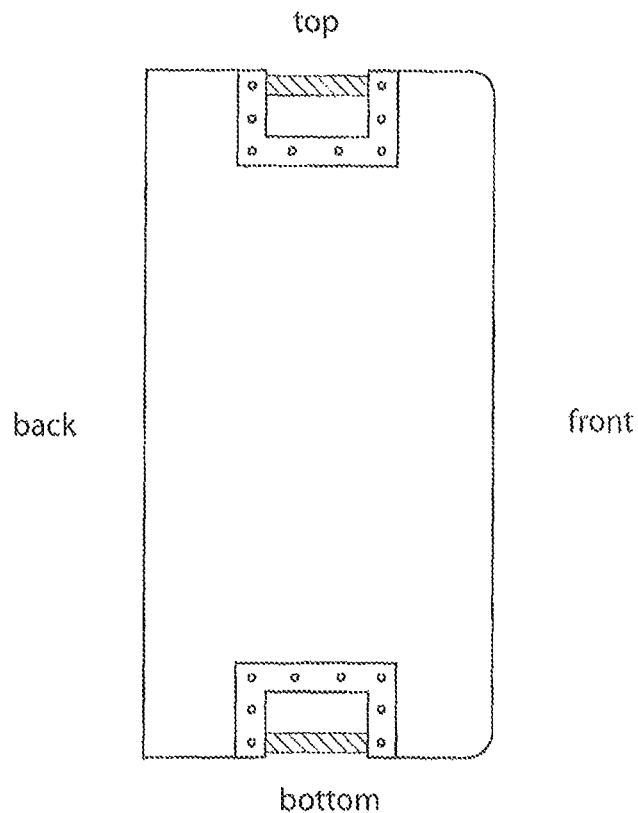
FIG. 6A shows an embodiment of a side view of a speaker enclosure with handle assemblies.
Figure 6B:
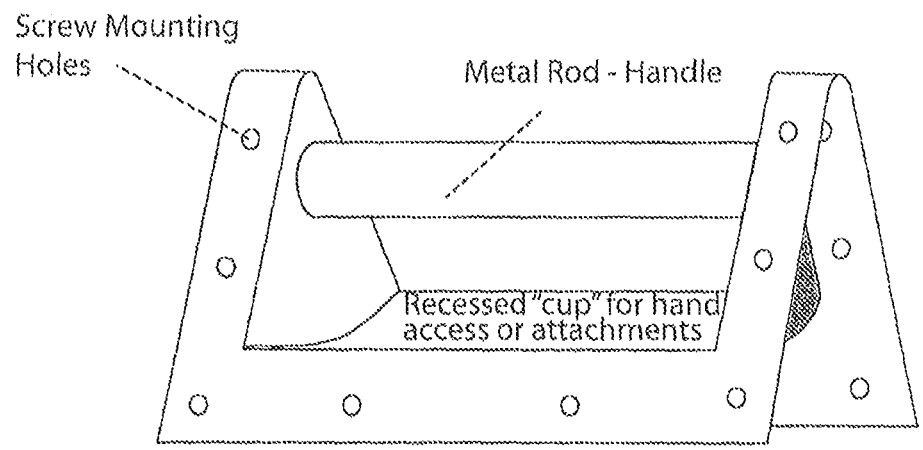
FIG. 6B shows an embodiment of a handle assembly from FIG. 6A.
Figure 6F:
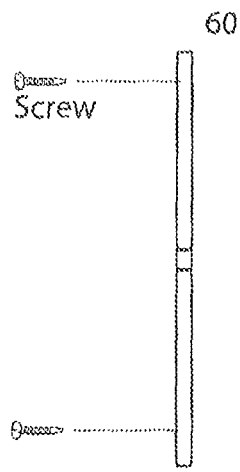
FIGS. 6F-6G show views of another embodiment of a locking bracket or hinge.
Figure 6G:
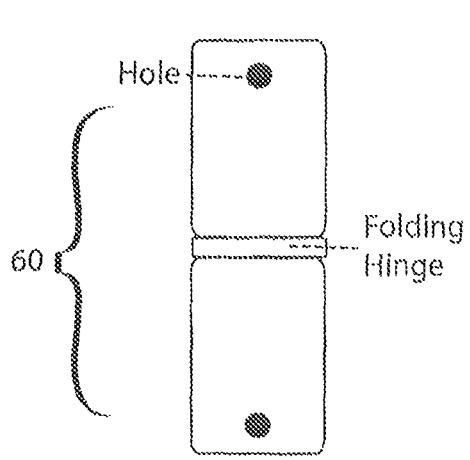
Figure 6H:
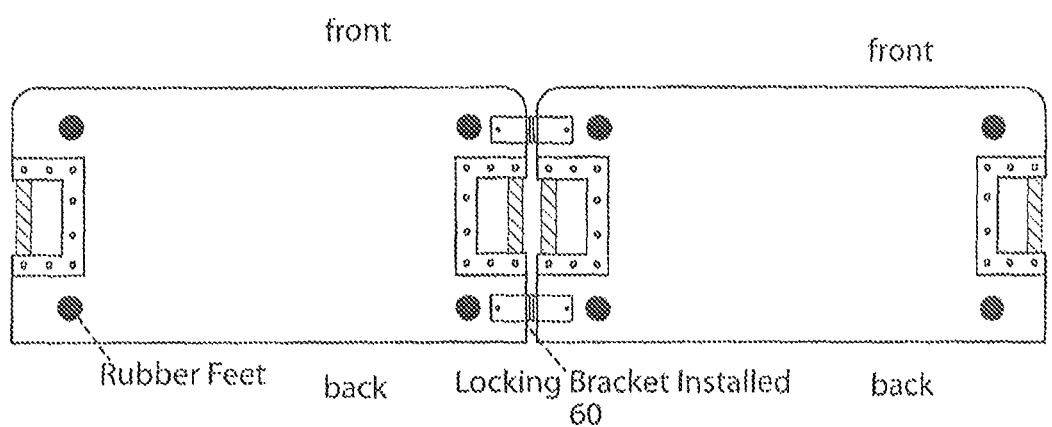
FIG. 6H shows two speaker enclosures connected with a pair of locking brackets or hinges in one embodiment.
Figure 7A:
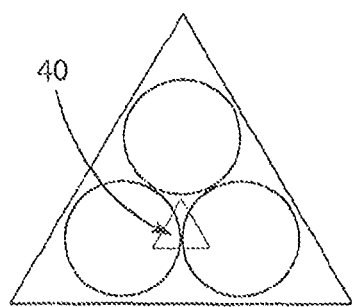
FIGS. 7A-7F show views of triangular-shaped enclosure subframes contained in a rectangular exterior enclosure shell with a triangular port or ports in the front or back baffle panels in various embodiments.
Figure 7B:
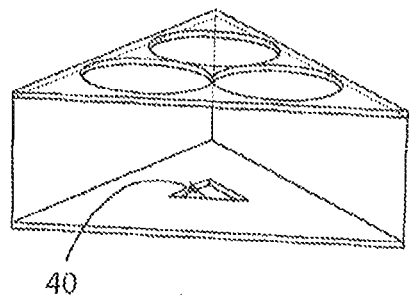
Figure 7C:
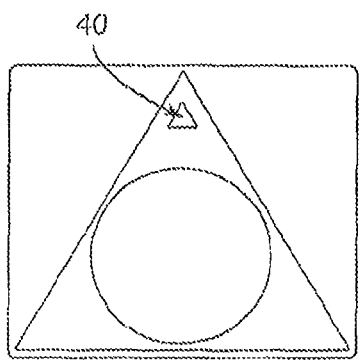
Figure 7D:
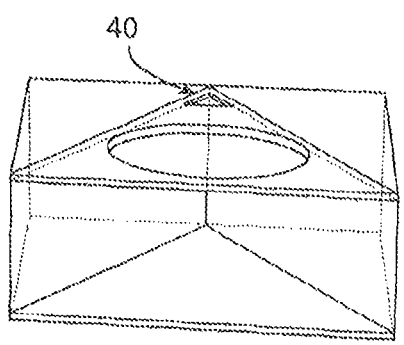
Figure 7E:
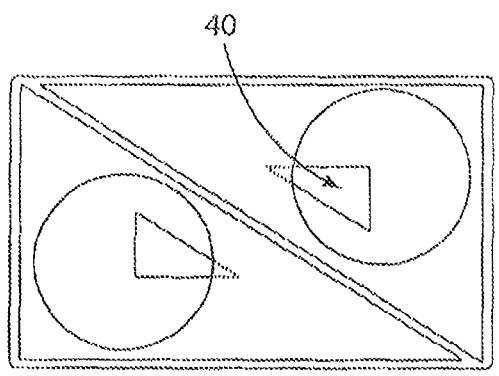
Figure 7F:
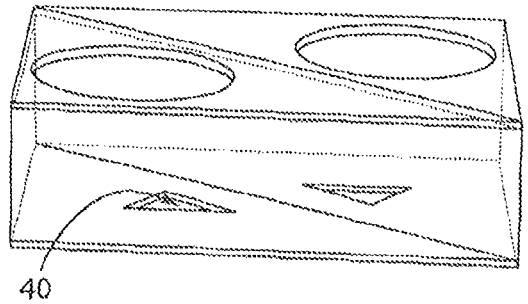

Several exemplary embodiments also may comprise one or more locking members or attachments 60, configured to facilitate stacking and/or other speaker configuring. For example, the locking member(s) 60 may couple with one or more of the handle members 32 to lock multiple speaker enclosures together, as seen in FIGS. 6C-6E. Alternatively, a locking bracket 62 with a hinge may fastened by screws (or otherwise) to adjacent speaker enclosures, as seen in FIGS. 6F-6H. This may increase rigidity of speaker clusters, reducing undesired sound distortion due to cabinet vibrations at higher sound pressure levels. In some embodiments, the speaker clusters could be friction held in place.

Further, the shape may be designed to provide strength to the enclosure (e.g., selection of a symmetric triangular shape may provide a certain amount of strength), and/or its acoustic properties (e.g., the shape, size, material, and/or other physical properties may affect the resonance of the enclosure). Even further, the size of the enclosure may be determined according to certain conventional dimensions of speaker systems. For example, the size may be selected to fit in a conventional location on a stage, to be carried in a conventional-sized hard case, to be light enough for single-person lifting, and the like.

Figure 4A:
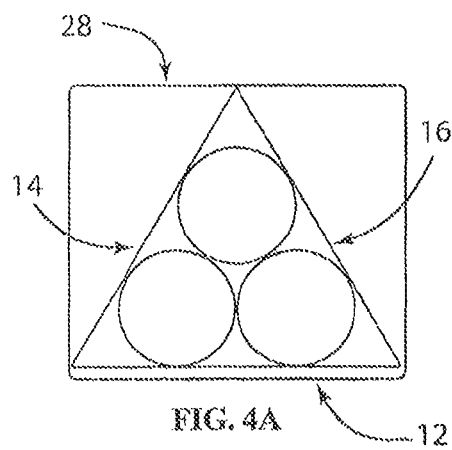
FIGS. 4A-4V show views of embodiments of triangular-shaped enclosure subframes with fixed or detachable panels contained in a rectangular exterior enclosure shell for various embodiments.
Figure 4B:
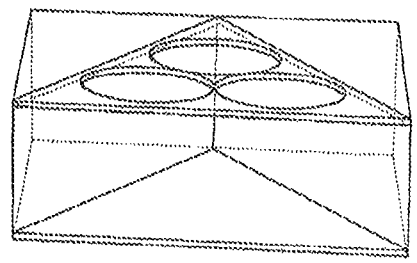
Figure 4C:
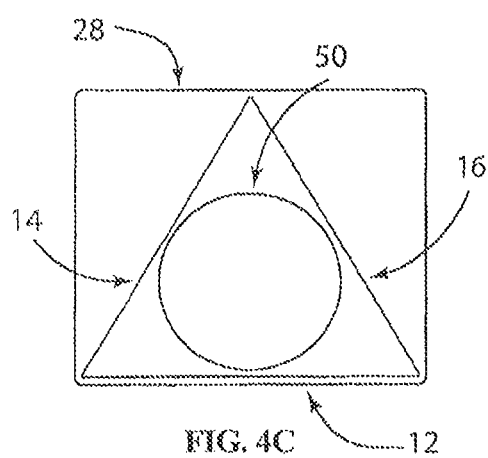
Figure 4D:
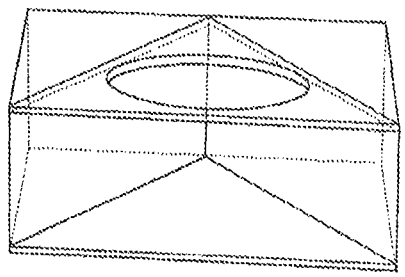
Figure 4E:
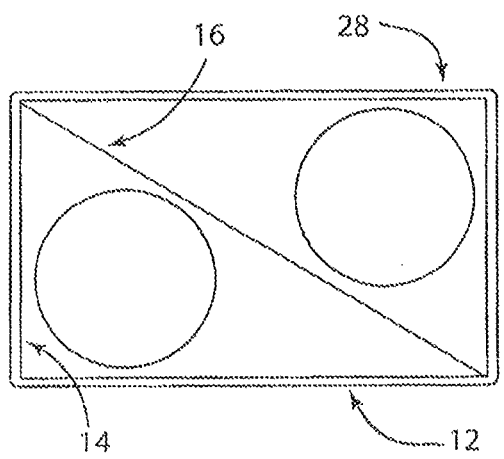
Figure 4F:
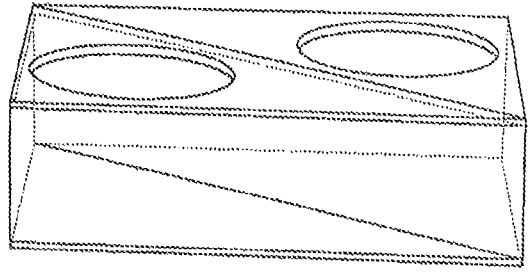
Figure 4G:
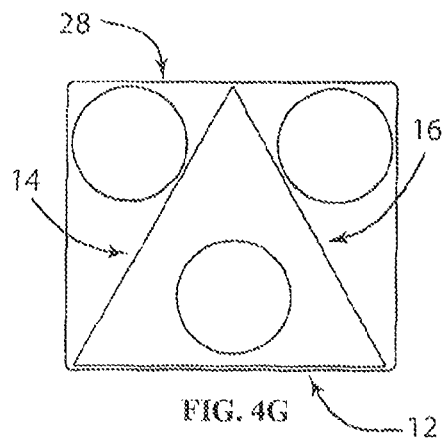
Figure 4H:
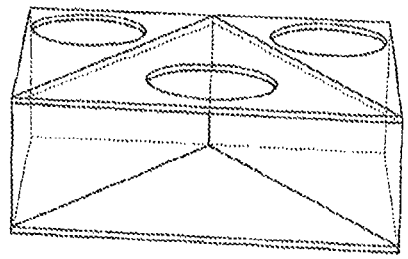
Figure 4I:
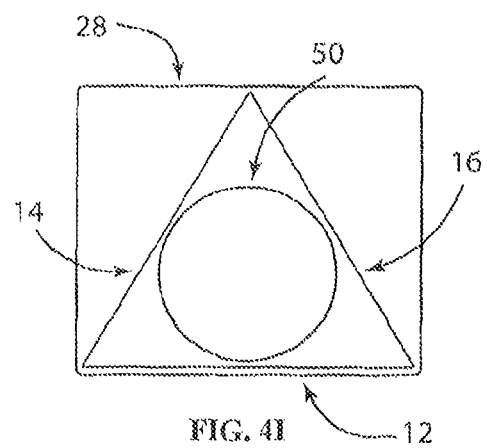
Figure 4J:
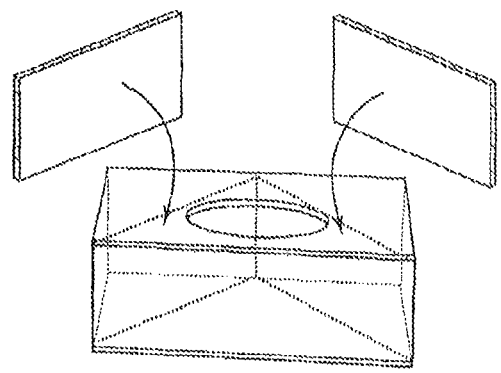
Figure 4K:
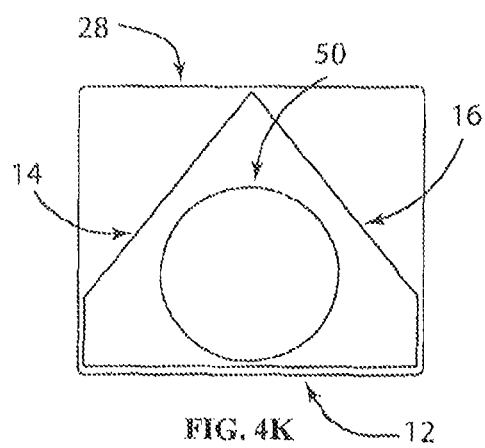
Figure 4L:
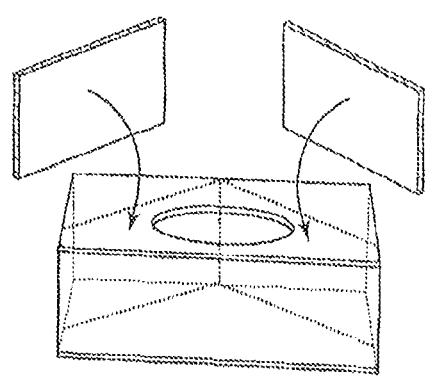
Figure 4M:
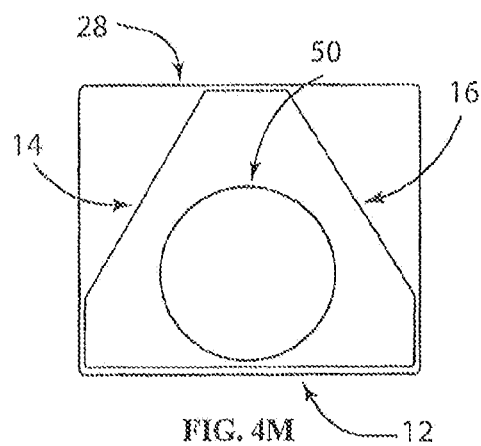
Figure 4N:
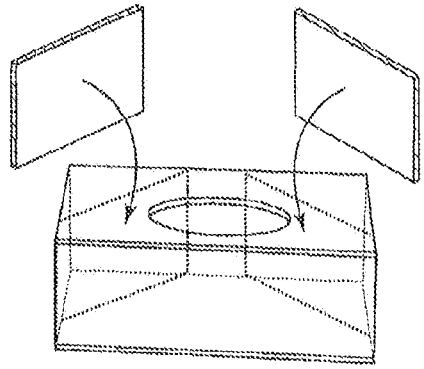
Figure 4O:
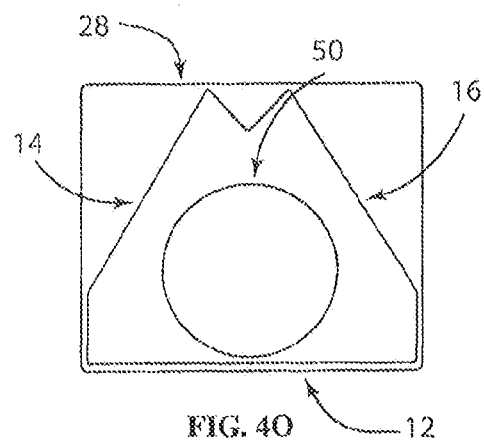
Figure 4P:
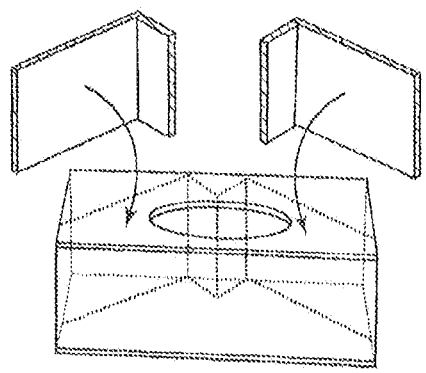
Figure 4Q:
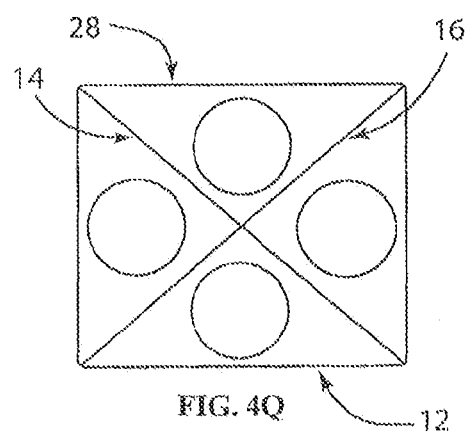
Figure 4R:
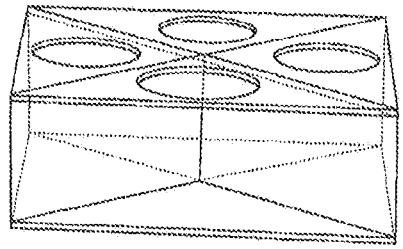
Figure 4S:
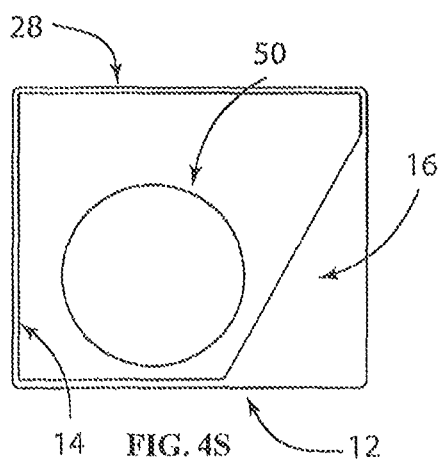
Figure 4T:
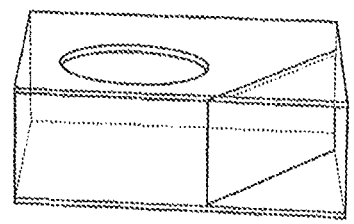
Figure 4U:
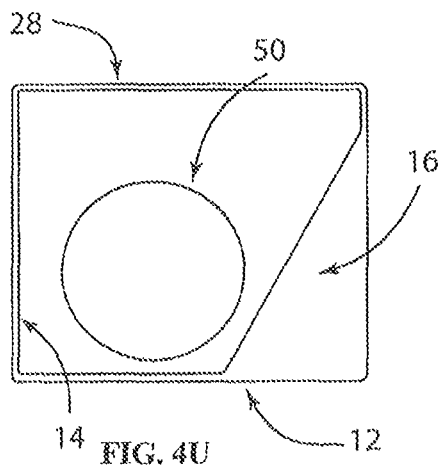
Figure 4V:
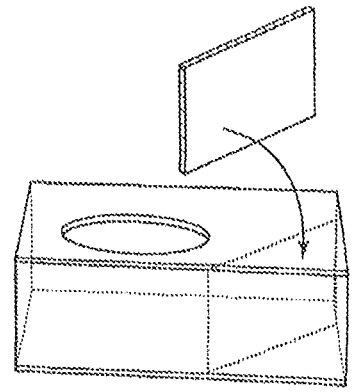

FIGS. 4A-4V show several embodiments of a speaker enclosure where a single or multiple triangular enclosure frame(s) (or subframe(s)), comprised of the bottom panel 12, left panel 14, and right panel 16, is contained inside of a rectangular exterior enclosure shell 28. The front baffle panel 18 may be rectangular and extend across the front of the rectangular exterior enclosure shell. Alternatively, the front baffle panel may extend only across the front of the triangular enclosure subframe, with additional front panels to fill in the additional space across the front. The back baffle panel, if present, may be constructed in a similar fashion. As shown in FIGS. 4A-4V, a single exterior enclosure shell may contain multiple enclosure subframes, and each enclosure subframe may encompass one or more speakers as well as other electronic components and circuitry.

In several embodiments, the enclosure comprises additional internal space for the purpose of accommodating electronic circuitry (e.g., an amplifier chassis containing electronic circuitry). Thus, for example, as seen in FIGS. 9A-9D, a speaker enclosure 100 may include a triangular enclosure subframe creating a triangular speaker chamber 110 in addition to isolated space 120 set aside to accommodate an amplifier chassis, tubes, transformers, electronic components, circuitry, or other apparatus. The triangular enclosure subframe may have part of the triangle curtailed to fit into the speaker enclosure 100. Even further, the electronic components, circuitry, vacuum tubes and the entire electronic chassis assembly may be isolated in a chassis pocket 130 away from the direct air movements generated by the speaker driver to minimize microphonics and vibrations.

Figure 10:
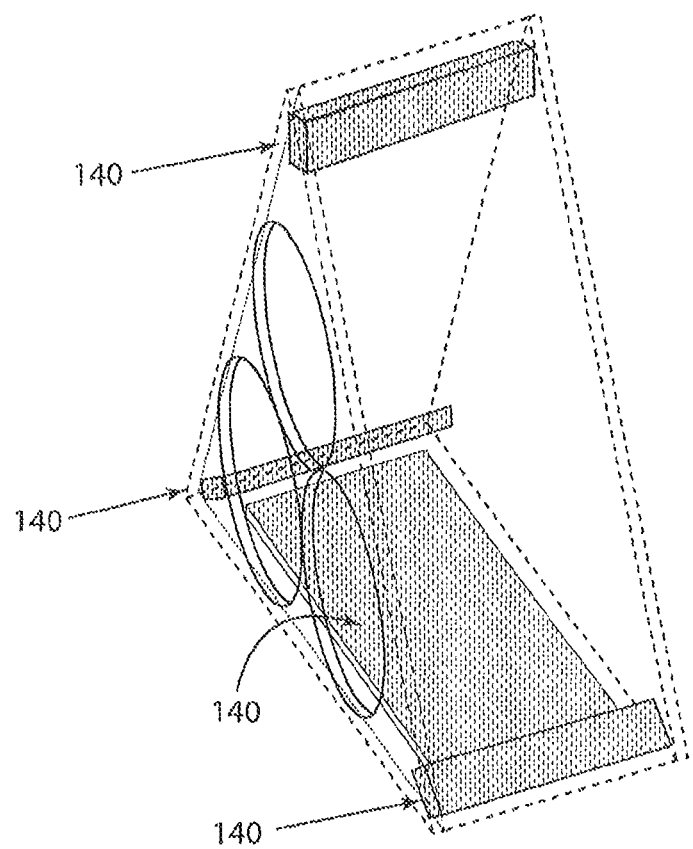
FIG. 10 shows an embodiment of a triangular-shaped speaker enclosure with interior foam.

In several embodiments, some or all of the internal surface area of the enclosure frame is layered or covered with a material having a particular acoustical property. In one embodiment, the internal surface area of one or more panels of the enclosure frame is covered with a high-density cellulose material 140 (e.g., a foam). This may effectively break up standing waves that may form during operation of the speakers mounted within the enclosure. In one embodiment, the internal base panel and internal corner members are treated with foam 140, as shown in FIG. 10. The amount, type, and/or location of the material may affect the acoustical properties, and may be selected according to certain design considerations. For example, it may be desirable to balance the mitigation of standing wave issues, the over-damping (e.g., muddiness) of the sound caused by an excess of material, the cost of providing the material (e.g., including the cost of manufacturing certain types or shapes of foam, the cost of precision location of the material, and the like), and other factors.

Figure 11A:
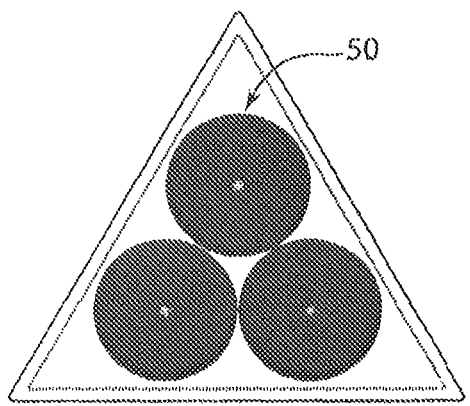
FIGS. 11A-11D show various embodiments of speakers mounted on the front baffle panel of a triangular-shaped speaker enclosure.
Figure 11B:
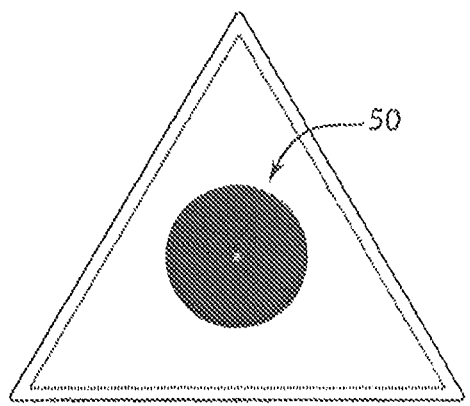
Figure 11C:
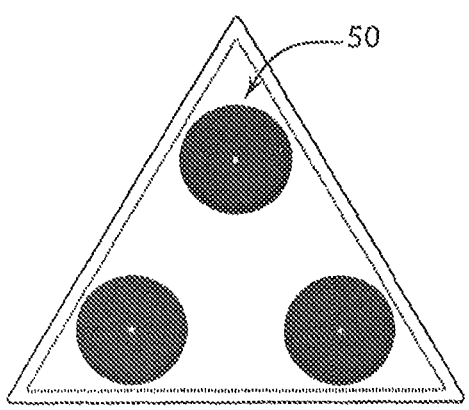
Figure 11D:
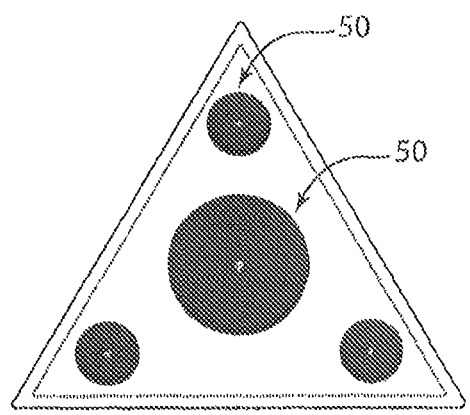

Embodiments of the speaker enclosure are loaded with one or more speakers 50, which are mounted in the speaker openings 22. In certain embodiments, multiple speakers are mounted substantially equidistant (e.g., radially) from a center point of the enclosure (see FIGS. 1B, 11A). This may produce an effect similar to that of a single point source. Other configurations are possible. In one embodiment, a single speaker is mounted in the center of the enclosure (see FIG. 11B). In another embodiment, three speakers are mounted at each corner of the triangular-shaped enclosure (see FIG. 11C). In still another embodiment, a single speaker is mounted in the center of the enclosure, and three speakers, which may be of a different size than the center speaker, are mounted in a triangle shape at each corner of the enclosure (see FIG. 11D), Wherein each set of three speakers is spaced equidistant from the center of the speaker mounted in the center of the enclosure.

Figure 12A:
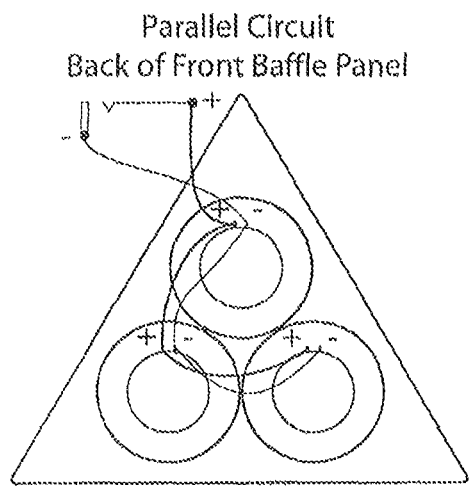
FIGS. 12A-12D show various wiring configurations for speakers mounted on the front baffle panel of embodiments of a triangular-shaped speaker enclosure.

In embodiments where multiple speakers are used, the speakers may be coupled in a variety of ways. In one embodiment, the speakers are electronically coupled as a parallel network (see FIG. 12A). For example, the impedances of three speakers in the enclosure may be modeled substantially as three resistors coupled in parallel between a common power source. The parallel circuit configuration driven by a power amplifier may reduce, or even eliminate, combined voltage and current changes that may be associated with typical series-parallel electronic circuits. This may effectively produce a perceivable immediacy to the amplified sound.

Figure 12B:
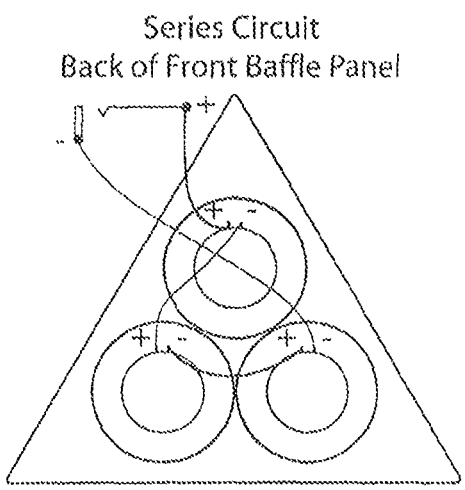
Figure 12C:
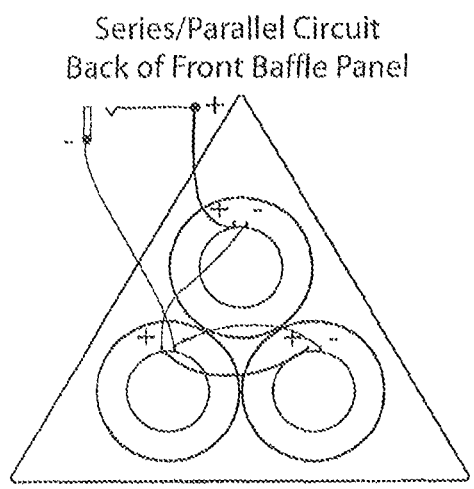

It will be appreciated that other circuit configurations are possible. For example, series or series-parallel networks are possible (see FIGS. 12B-12D). In certain embodiments, one or more additional components may be included as part of the speaker circuitry. For example, the circuitry may include power components (e.g., adaptors, supplies, transformers, rectifiers, conditioners, and the like), audio components (e.g., filters), and other devices (e.g., switching input jacks).

Figure 12D:
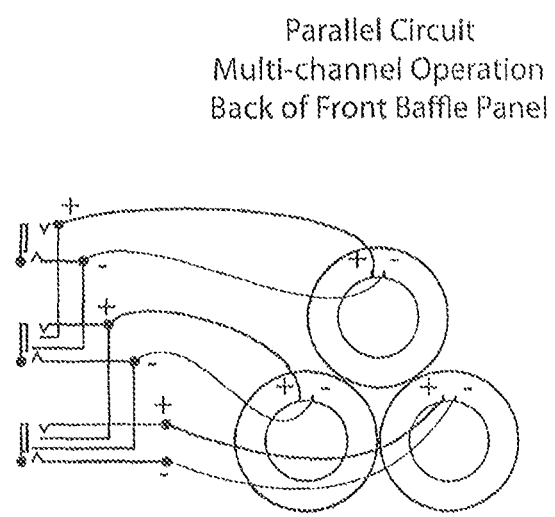
Figure 12E:
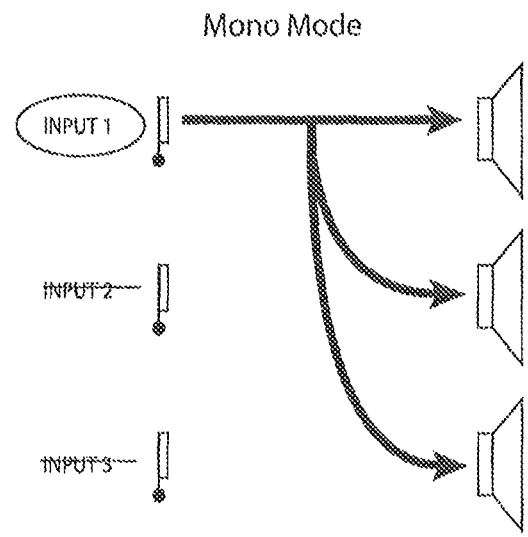
FIGS. 12E-12K show various operating modes for a particular wiring configuration in one embodiment.
Figure 12F:
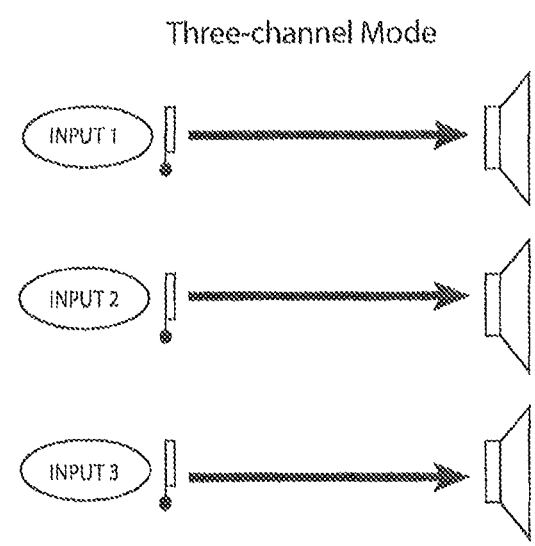
Figure 12G:
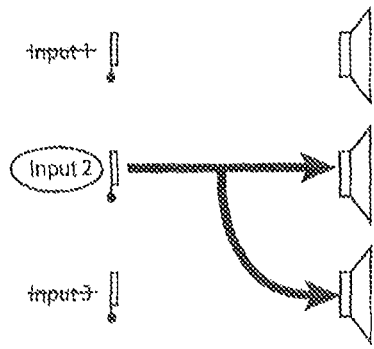
Figure 12H:
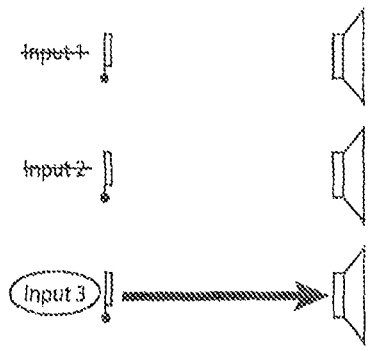
Figure 12I:
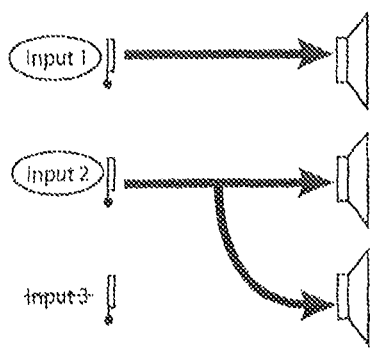
Figure 12J:
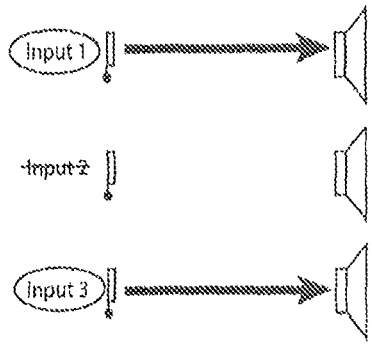
Figure 12K:
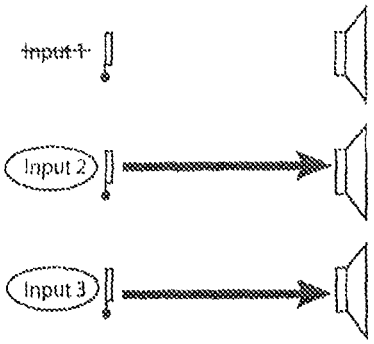

In some embodiments, the circuit configuration is arranged to allow the user a number of optional operating modes. In one mode, the user has a choice of mono sound reproduction (e.g., single or multiple speakers reproducing the same signal). In another mode, the user has a choice of two-channel sound reproduction (e.g., single or multiple speakers reproducing two separate signals). In another mode, the user has the option of tri-channel sound reproduction (e.g., multiple speakers reproducing three separate signals). As shown in FIG. 12D, three switching input jacks are electronically coupled in a parallel network providing an access point to each individual speaker driver. It will be appreciated that this circuit configuration is capable of the plurality of sound reproduction modes.

Figure 13:
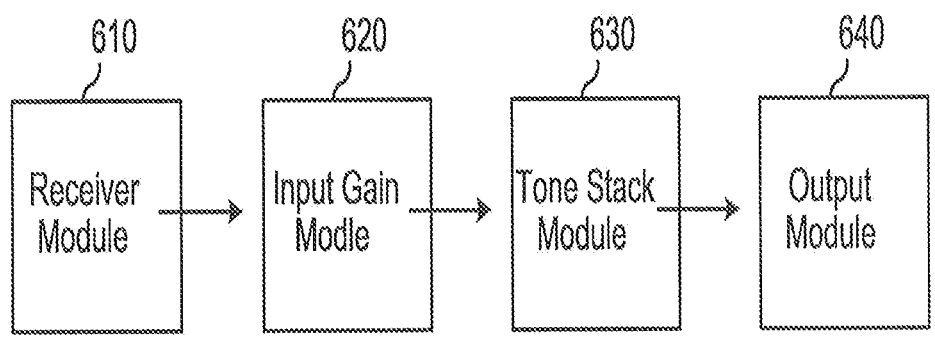
FIG. 13 shows components of a guitar amplifier for one embodiment.
Figure 14:
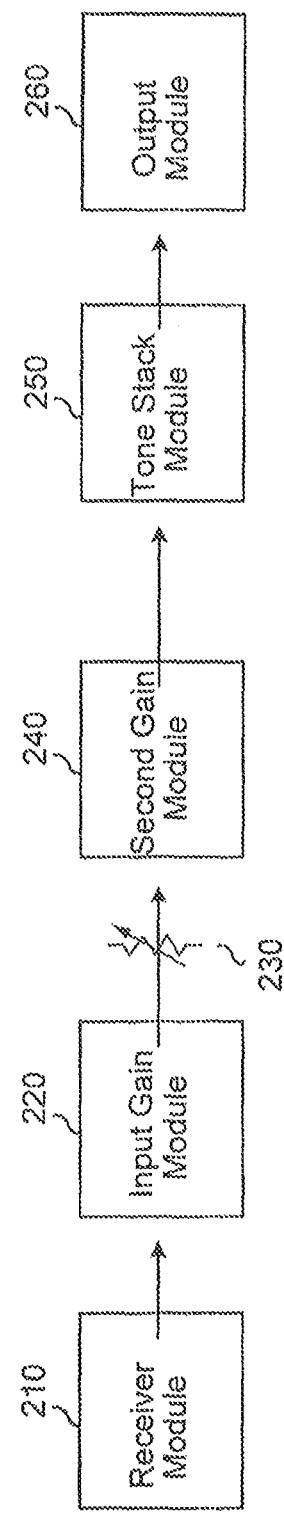
FIG. 14 is a block diagram of a guitar amplifier with an enhanced distortion circuit in accordance with prior art.
Figure 15:
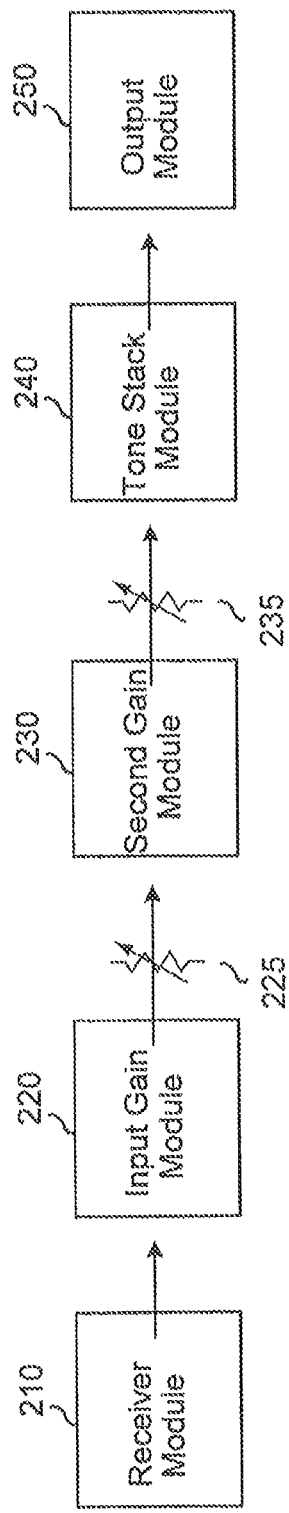
FIG. 15 is a block diagram of a guitar amplifier with a further enhanced distortion circuit in accordance with prior art.
Figure 16:
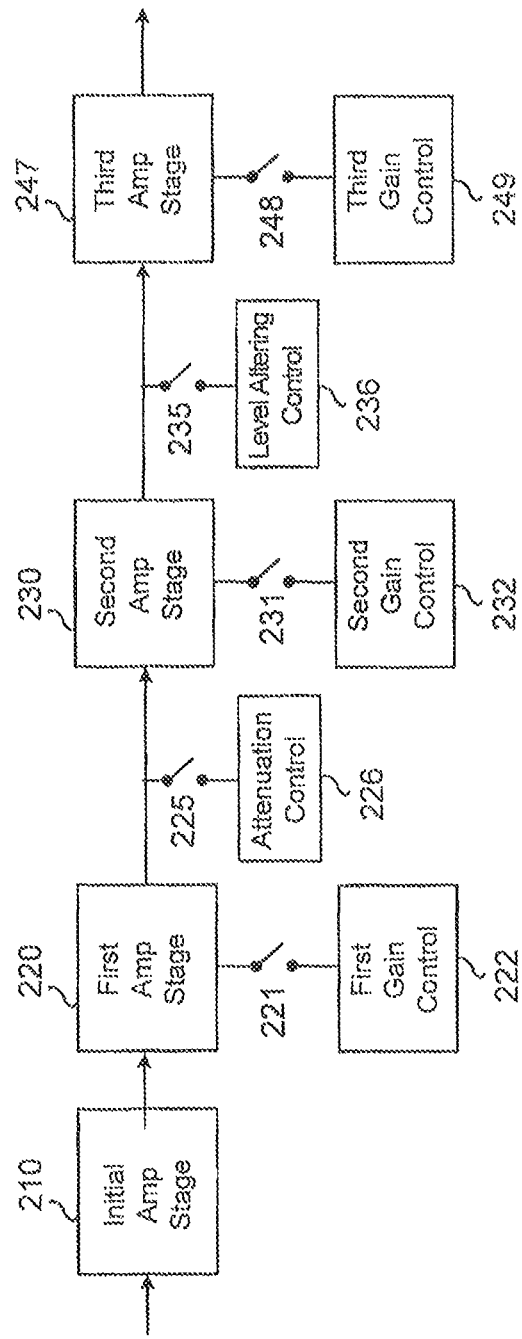
FIG. 16 is a block diagram of a guitar amplifier with a multi stage preamplifier circuit in accordance with prior art.
Figure 17:
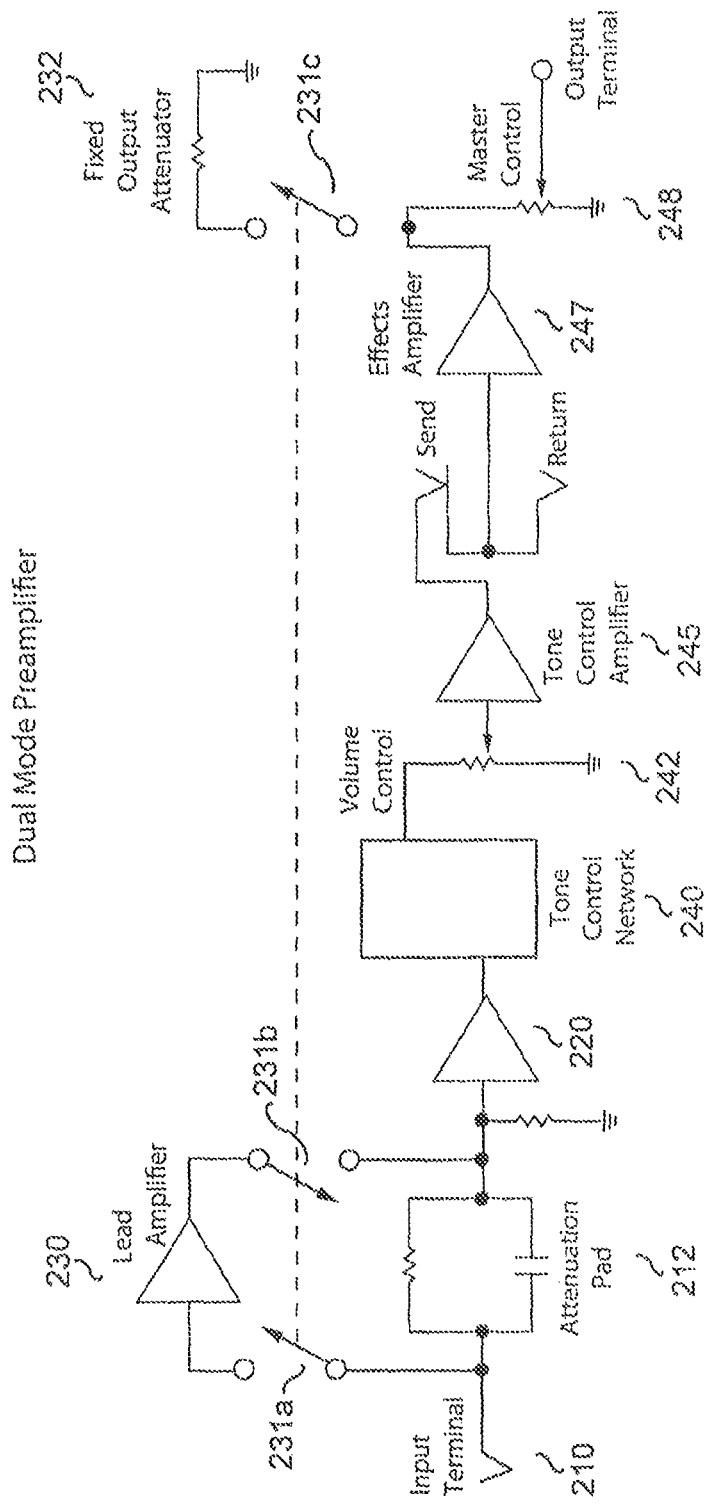
FIG. 17 is a block diagram of a guitar amplifier with a dual mode preamplifier circuit in accordance with prior art.
Figure 18:
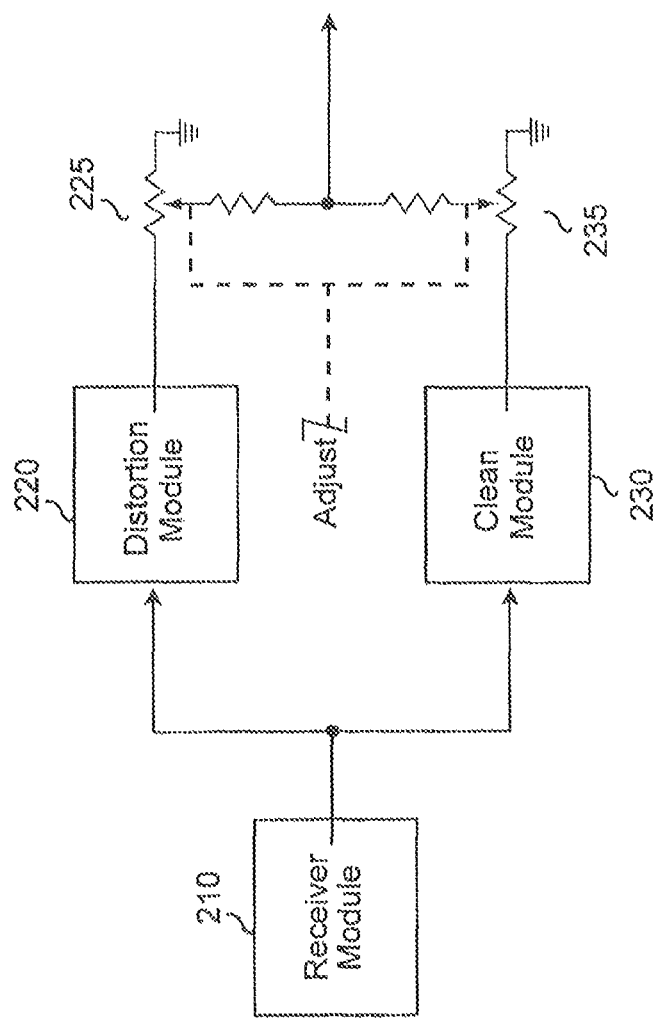
FIG. 18 is a block diagram of a guitar amplifier with a distortion control preamplifier circuit in accordance with prior art.

Embodiments of speaker systems (e.g., including the speaker systems disclosed above with respect to FIGS. 1-12) may typically be driven by a guitar amplifier. As shown in FIG. 13, embodiments of a guitar amplifier 600 may include a receiver module 610, an input gain module 620, a tone stack module 630, and an output module 640. In various embodiments, one or more of these modules may include various analog or digital components, including, for example, vacuum tubes, transistors, and similar components.

An audio signal is received at the amplifier 600 by the receiver module 610. For example, the audio signal may be communicated from a guitar, through a standard instrument cable, and into a port in the receiver module 610 that is configured to receive the signal from the instrument cable. The audio signal may typically be amplified by the input gain module 620 (e.g., acting as a first gain stage that may be controlled at least in part by a volume control, like a volume knob on the amplifier), then processed (e.g., "finished," filtered, or the like) according to a desired tone profile by the tone stack module 630. The amplified and processed signal may then be passed to the output module 640, which may prepare the signal to be communicated to a speaker. For example, the output module 640 may include one or more additional gain stages, drivers, filters, ports, controls, and similar components. In many high-gain tube guitar amplifiers, multiple gam stages are used sequentially to provide a desired effect. For example, at each gain stage, the amplifier applies gain to the signal, then brings the signal back under control, before moving on to the next stage. While this may increase the signal gain over multiple stages and allow for tailoring of the tone, it may also significantly impact the objective dynamic structure and subjective "feel" of the amplifier.

FIGS. 14-18 show various prior art guitar amplifiers showing various places to attenuate the amplifier.

Figure 19:
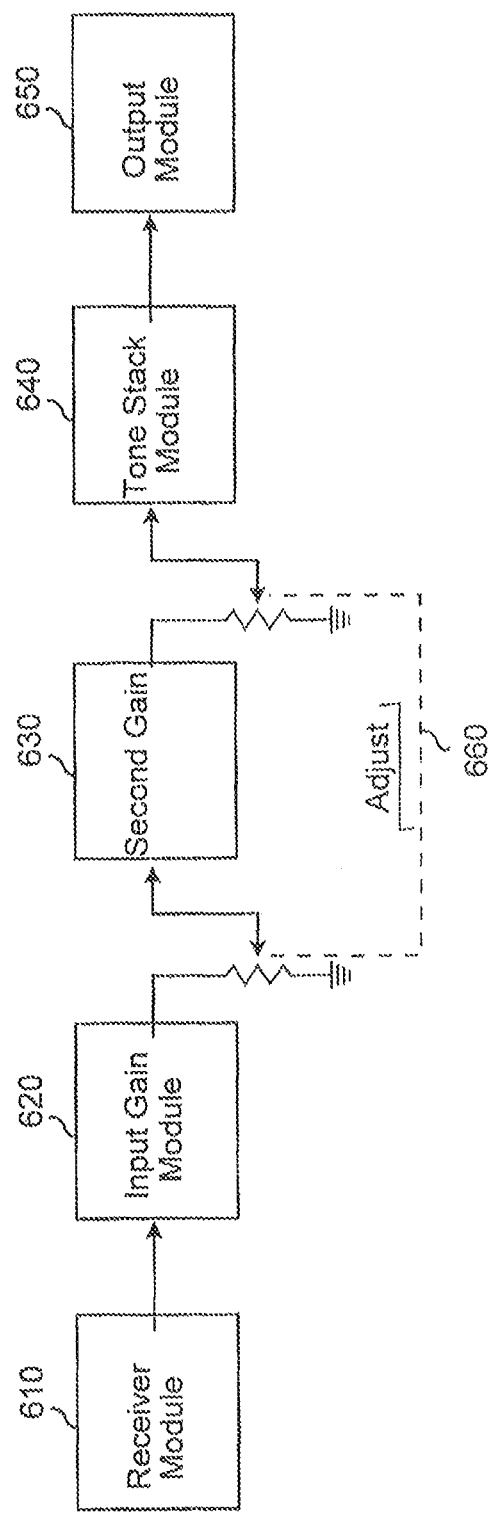
FIG. 19 shows components of a guitar amplifier in accordance with an embodiment of the present invention.

Embodiments of speaker systems (e.g., including the speaker systems disclosed above with respect to FIGS. 1-12) may typically be driven by an amplifier. As shown in FIG. 19, embodiments of an amplifier 600 may include a receiver module 610, a first input gain module 620, a second gain module 630, a tone stack module 640, and an output module 650. In various embodiments, one or more of these modules may include various analog or digital components, including, for example, vacuum tubes, transistors, and similar components.

An audio signal may be received at the amplifier 600 by the receiver module 610. For example, the audio signal may be communicated from a guitar, through a standard instrument cable, and into a port in the receiver module 610 that is configured to receive the signal from the instrument cable. The audio signal may typically be amplified by the input gain module 620 (e.g., acting as a first gain stage that may be controlled at least in part by a volume control, like a volume knob on the amplifier), then fed into a second gain module 630 (e.g., acting as a second gain stage that may be controlled at least in part by a volume control, like a volume knob on the amplifier), then processed (e.g., "finished," filtered, or the like) according to a desired tone profile by the tone stack module 640. Overall control of the clean or harmonically saturated content of the signal may be controlled by a dual ganged volume control 660. The amplified and processed signal may then be passed to the output module 650, which may prepare the signal to be communicated to a speaker. For example, the output module 650 may include one or more additional gain stages, drivers, filters, ports, controls, and similar components.

In many high-gain tube guitar amplifiers, multiple gain stages are used sequentially to provide a desired effect. For example, at each gain stage, the amplifier applies gain to the signal, then brings the signal back under control, before moving on to the next stage, While this may increase the signal gain over multiple stages and allow for tailoring of the tone, it may also significantly increase noise and hiss, and impact the objective dynamic structure and subjective "feel" of the amplifier.

Figure 20A:
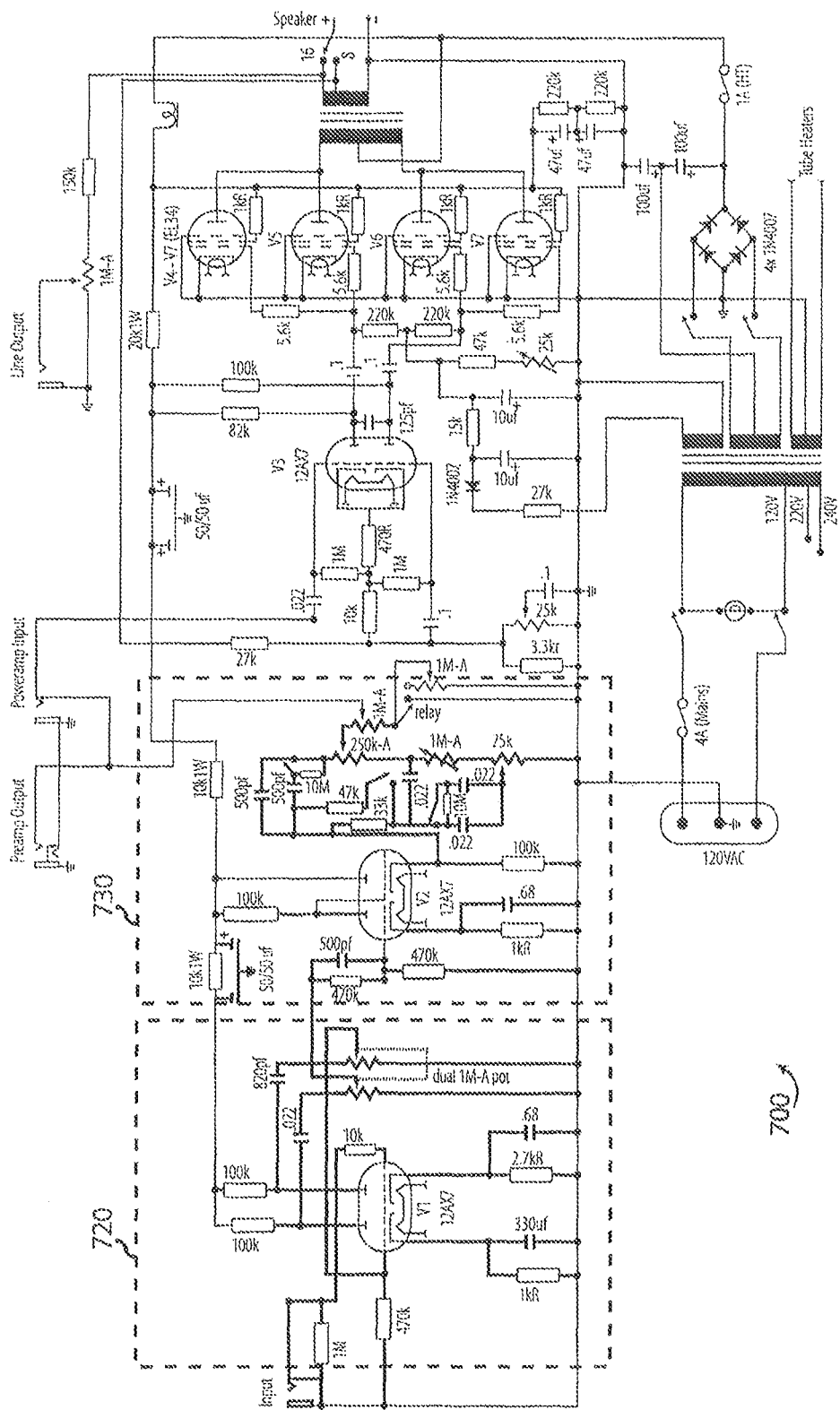
FIG. 20A is a schematic diagram of an embodiment of an amplifier circuit with a gain module and tone stack module.
Figure 20C:
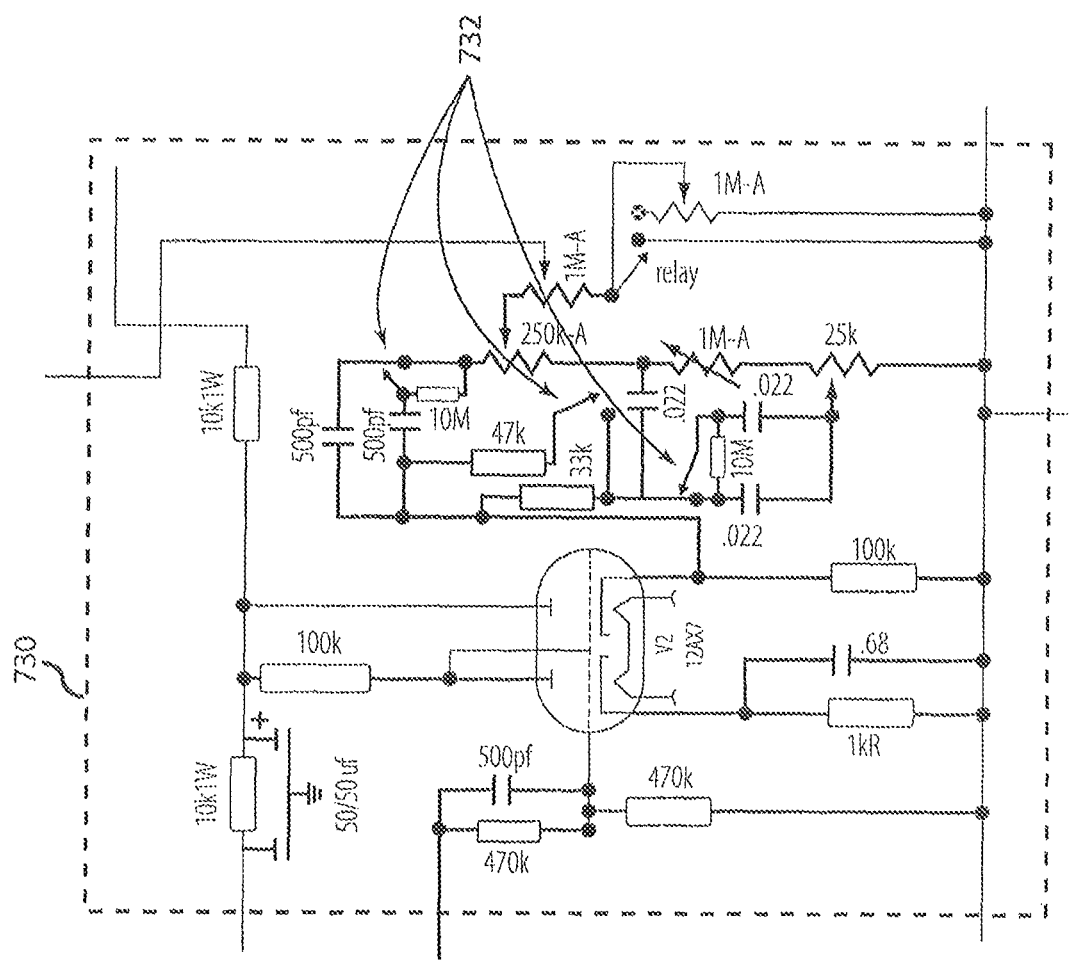
FIG. 20C is a schematic diagram of an embodiment of a tone stack module of FIG. 20A.

FIGS. 20A-20C show a schematic diagram of an amplifier circuit 700, according to various embodiments of the invention. The amplifier circuit includes a novel input gain module 720 and a novel tone stack module 730. As shown, V1 is a dual-triode tube (two separate amplification devices inside of a vacuum sealed glass ease) operating at preset, high levels of amplification. It will be appreciated that variable levels of amplification would also fall well within the scope of the present invention. The input signal is fed into a first part of V1. In one embodiment, this provides a potential factor of 100 with regard to signal gain. The output of the first part of V1 is fed into a second part of V1. In one embodiment, this re-applies the gain factor. For example, a gain factor of 100 may be effectively applied twice, which may provide a factor of close to 10,000 with respect to signal gain.

It will be appreciated that both audio signal and inherent noise levels between input gain module 720 and tone stack module 730 are proportionally controlled in tandem (ganged) by a dual 1M potentiometer arranged as a variable voltage divider to operate as a signal attenuator with an input terminal connected to incoming audio signals, an audio signal output terminal connected to the wiper, and a voltage reference via a third terminal connected to ground. It will be appreciated that one effect of the input gain module 720 may be a buildup of distortion. This may cause the amplifier 700 to clip the signal with square wave characteristics, the clipping sound to be prominent (e.g., always present along with the original signal), and stronger note transitions (e.g., a guitarist strumming or picking the notes harder) to be reproduced with a distortion effect. As such, some embodiments include a dual gain control module. As shown in FIGS. 20A and 20B, a dual 1M potentiometer 726 is included to simultaneously control signal levels in two locations, the feed-forward path of the input gain module 720 (e.g., as the signal is being fed from the first part of V1 to the second part of V1) and the input of the tone stack module 730 (e.g., as the signal is being fed from the second part of V1 to the first part of V2).

This may effectively manage the signal levels and allow the amplifier 700 to exploit low level and high level input signals more effectively while potentially reducing operating noise and hiss. This may allow a guitarist to reproduce clean sounds (e.g., sounds that are free of clipped signals) as well as overdriven signals (e.g., sounds that are heavily saturated with clipped signals) by adjusting a single control knob attached to the dual 1M potentiometer with greater perceived signal quality and reduction in operating noise. Setting this control in a range from 1%-40% of maximum may produce various clean sounds (e.g., sounds that are free of clipped signals). It will be appreciated that tone stack module 730 will be fed a signal that represents up to 100% of the available signal gain from the first part of V1 that is first attenuated by up to 60% at the first voltage divider of the dual potentiometer then re-amplified by up to 100% of the available signal gain from the second part of V1 that is first attenuated by up to 60% at the second voltage divider of the dual potentiometer. Setting this control in a range of 41%-80% of maximum may produce various overdriven sounds (e.g., sounds that are moderately or highly saturated with clipped signals). With settings in this range, the effect may be a desirable rich distortion and dynamic feel that responds well to low and high output pickups and soft and aggressive playing techniques (e.g., sharp and smooth attack envelopes on sounds forming the input signal). It will be appreciated that tone stack module 730 will be fed a signal that represents up to 80% of the available signal gain from the first part of V1 that is first attenuated by up to 20% at the first voltage divider of the dual potentiometer then re-amplified by up to 80% of the available signal gain from the second part of V1 that is first attenuated by up to 20% at the second voltage divider of the dual potentiometer. Setting this control in a range of 81%-100% of maximum may produce various distorted sounds (e.g., sounds that are heavily saturated with clipped signals). It will be appreciated that as the user approaches 100% full rotation of the dual potentiometer, tone stack module 730 will be fed an increasing audio signal and that attenuation of noise will become less perceivable.

In some embodiments, the amplifier 700 includes a tone stack module 730. In certain embodiments, the tone stack module 730 is communicatively coupled with a control (e.g., a switch) for selecting among multiple modes. For example, one embodiment includes a single-pull, triple-throw switch 732 for toggling between two modes. One mode of the tone stack module 730 is configured to mimic a standard tone stack (e.g., that of a Marshall" amplifier). This may allow a performer (e.g., in a cover band) to reproduce sounds created by players that use the mimicked, or a similar sounding, amplifier.

Notably, typical tone stacks often generate an output signal with frequency emphasis that is bass-heavy, mid-weak and high-heavy. For example, some stock Marshall™ tone stacks generate an output signal that manifests a three-to six-decibel dip at around one kilohertz. Many sound engineers and performers compensate for this effect using post-processing techniques, like outboard graphic equalizers, or mid-heavy speakers, to equalize the sound. For example, the signal may be amplified to bring the mid-range up to a desired level, and the low-range and high-range faders (or properties of the speaker) may then be used to counteract the effects of the tone stack. However, increasing the volume across the spectrum may also increase the noise floor and/or cause other undesirable effects. It will be appreciated that by switching the tone stack module 730 shown in FIGS. 20A and 20C to a second mode, frequencies around 1 kilohertz are amplified without significantly affecting the tonal qualities at low- and high-range frequencies.

Figure 21:
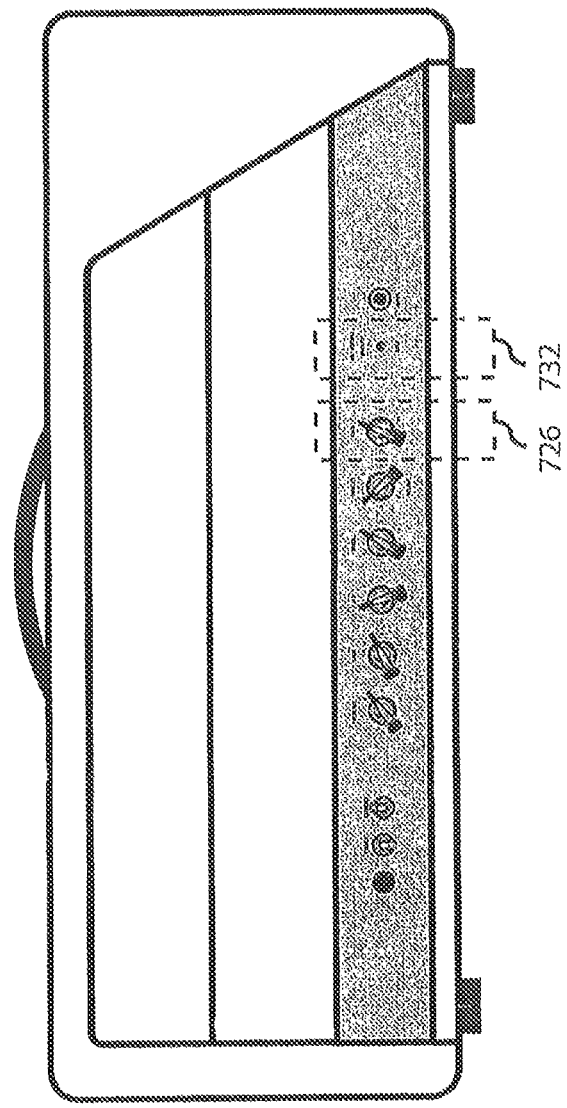
FIG. 21 is an elevation of a front view of an embodiment of an amplifier.
Figure 22:
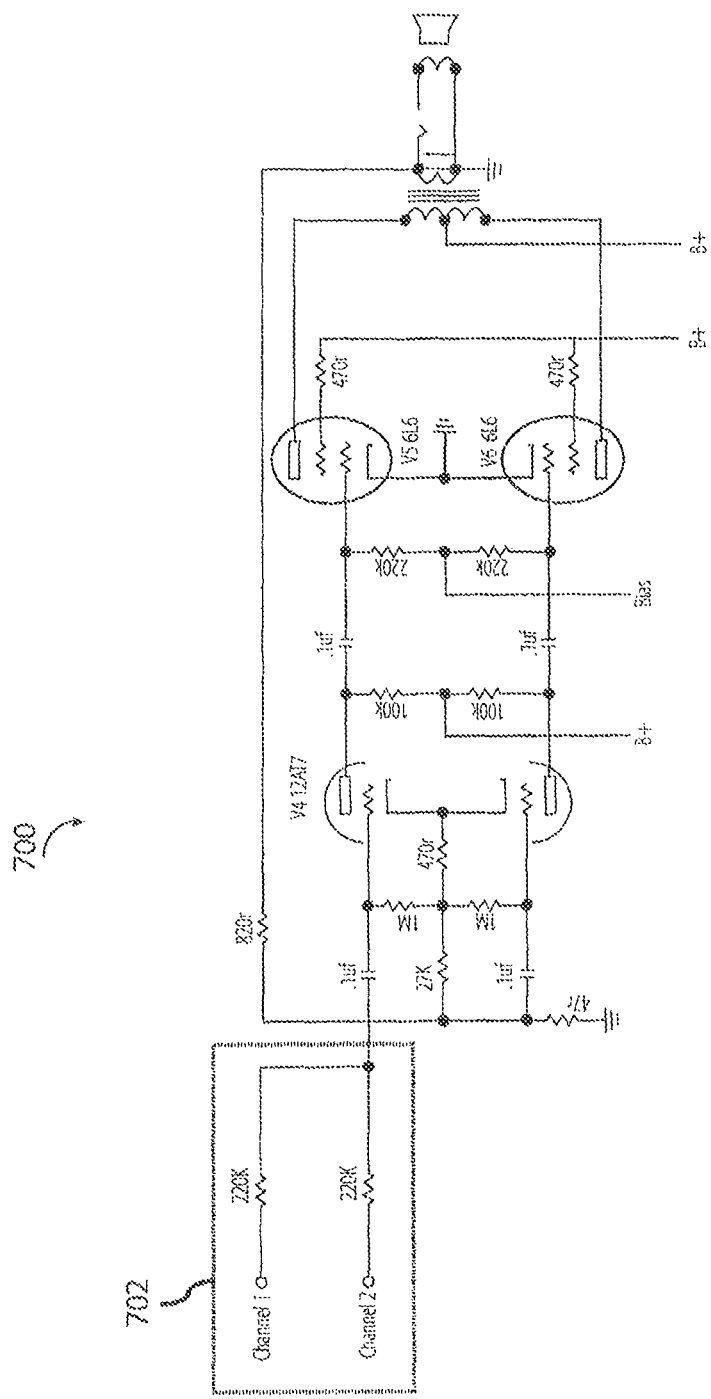
FIG. 22 is a schematic diagram of a mixdown module in accordance with prior art.

FIG. 21 shows an elevation of a front view of an embodiment of an amplifier enclosure. There is a knob for the potentiometer 726 and an EQ switch 732 to control attenuation, amplification and other effects for the amplifier. Various other knobs and switches As shown in example elevation view of FIG. 22, the control panel may be organized to provide instant access to gain control 730 and EQ switch 732. By interacting with these controls, the guitarist may easily achieve the desired content of clean or harmonically saturated signal.

Figure 23A:
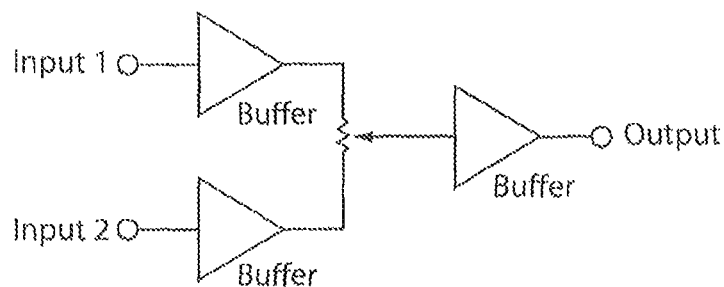
FIGS. 23A-B show block diagrams of a guitar amplifier with multiple signal inputs in accordance with prior art.
Figure 23B:
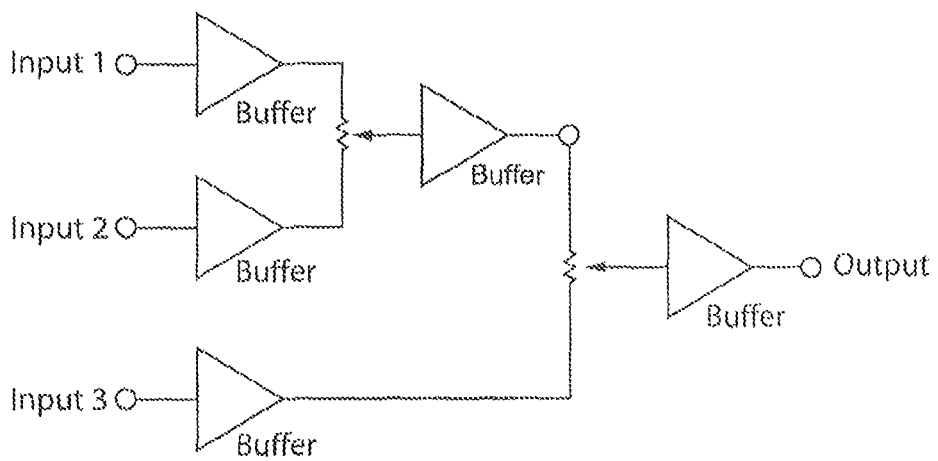

FIGS. 23A-B show block diagrams of a guitar amplifier with multiple signal inputs in accordance with prior art. The various inputs are mixed to varying degrees by adjusting potentiometers 726.

As shown in FIG. 24, embodiments of the amplifier 800 may include multiple receiver modules 810 and 840, multiple gain modules 820 and 850, multiple tone stack modules 830 and 860, a gain recovery module 870, a mixdown module 880, and an output module 890. In various embodiments, one or more of these modules may include various analog or digital components, including, for example, vacuum tubes, transistors, and similar components. Singular or plural audio signals may be received at the amplifier 800 by the receiver modules 810 and 840. The audio signals may typically be amplified separately by the input gain modules 820 and 850 (e.g., acting as a first gain stage that may be controlled at least in part by a volume control, like a volume knob on an amplifier), then processed (e.g., "finished," filtered, voiced, etc.) separately according to a desired tone profile by the tone stack modules 830 and 860. In some embodiments, tone stack modules 830 and 860 may present different processing (e.g., filtering, voicing, etc.) tone profiles. While this may provide multiple voicing options when tailoring the tone, it may also significantly impact the compatibility of the signal levels, dynamic structure and subjective "feel" of the amplifier.

Figure 25:
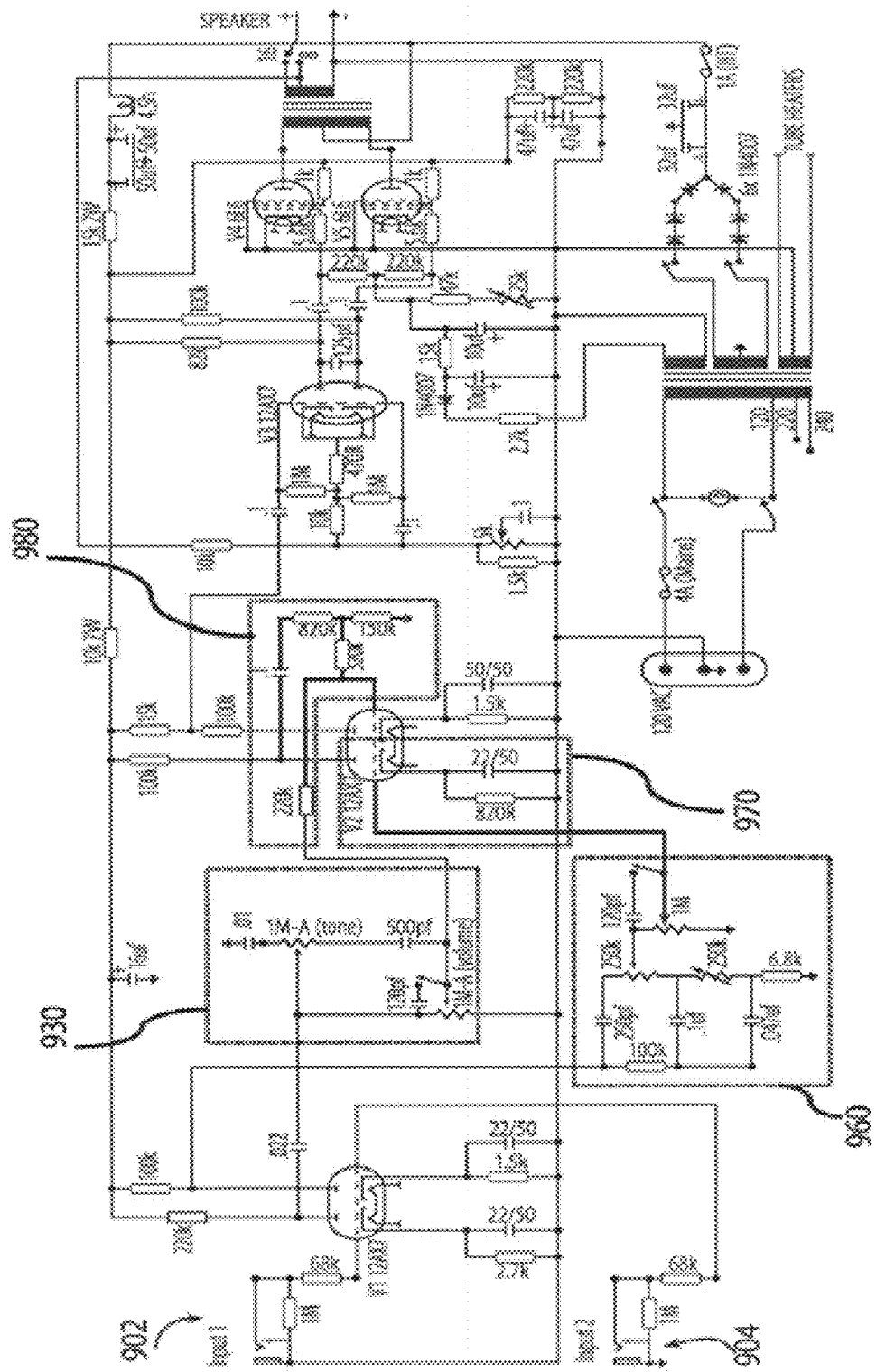
FIG. 25 is a schematic diagram of an embodiment of an amplifier circuit with a mixdown module.

FIG. 25 shows a schematic diagram of an amplifier circuit 900, according to various embodiments. The amplifier circuit includes a gain recovery module 970 and a novel mixdown module 980. Singular or plural input signals may be fed into either Input 1 902 or Input 2 904 or both. In one embodiment, the tone stack module 930 differs significantly from 960 (with 930 being simpler in design and possessing a significantly lower insertion loss than 960). It will be appreciated that bringing plural signal paths together (e.g., mixing, summing, etc.) with different impedances and signal strengths may produce an overall poor blend quality or imbalance to the tone and subjective "feel" of each channel, whether utilized simultaneously or individually. It will also be appreciated that each channel's tone and volume controls may interact with the other possibly altering or degrading the sound quality of one or the other, or both channels whether employed independently or simultaneously.

Figure 26:
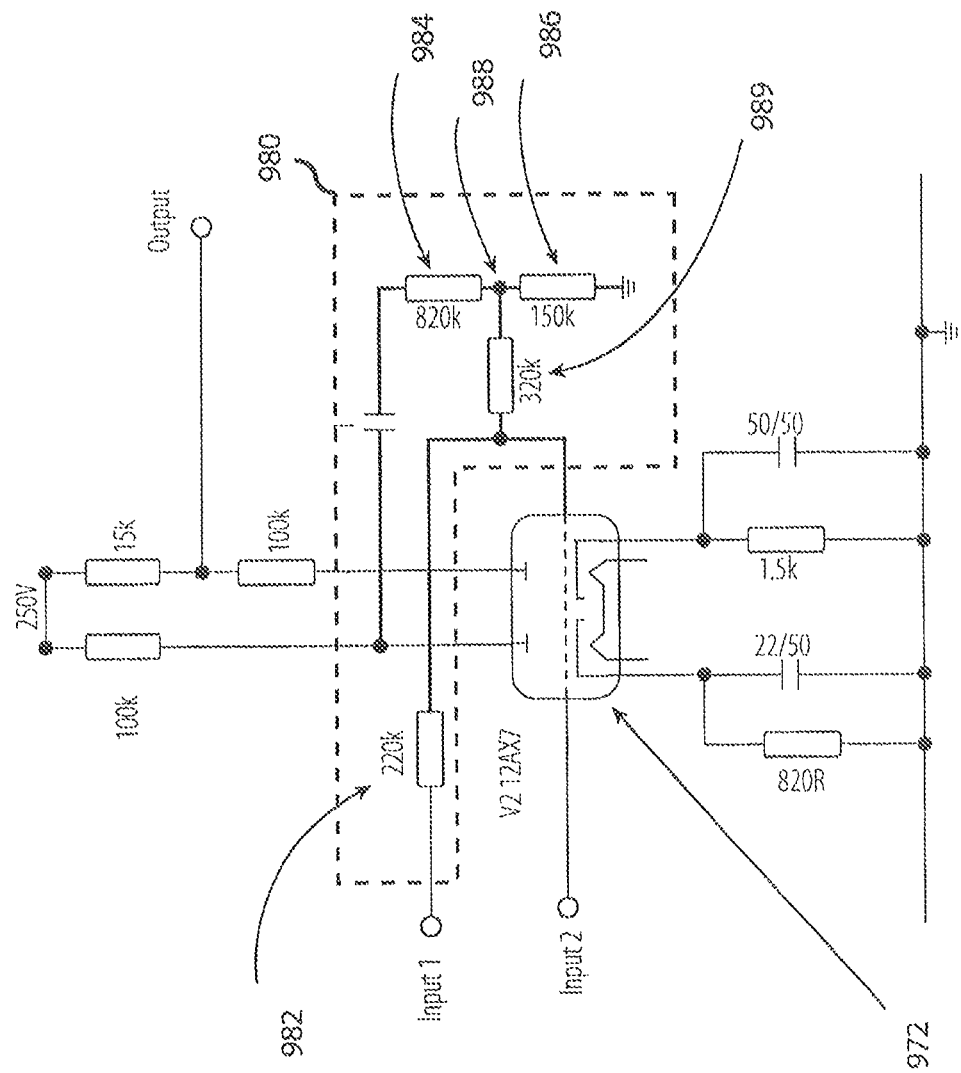
FIG. 26 is a schematic diagram of an embodiment of the mixdown module.

In some embodiments, the amplifier circuit 900 includes a gain recovery module 970. In certain embodiments, the gain recovery module 970 is employed to prepare the signal for the mixdown module 980. For example, one embodiment utilizes one half of a typical dual-triode tube 972 as shown in FIG. 26 to provide a reasonable gain factor with regard to the signal preparing it for summing with another signal at the mixdown module 980. This may also provide a circuit buffer or "barrier" between the two channels and somewhat reduce the sympathetic interactions between the two channels.

It will be appreciated that both a mismatch in signal levels, and adverse channel loading and interaction may still exist. For example, the signal level of one channel may be significantly larger than the other such that volume knob adjustments are not able to optimally blend the channels within reasonable balance and with the desired tonal response and subjective "feel." As such, some embodiments include a mixdown module 980. As shown in FIG. 26, a complex resistor network is included at the point of resolving or summing the signals thus more effectively preparing the newly mixed signal for further processing. Signals originating at Input 1 enter the mixdown module 980 through a 220K resistor 982. Signals originating at Input 2 enter the mixdown module 980 through a voltage divider network that first prepares the signal level for mixdown. The voltage divider network consists of an input resistor valued at 820K 984 connected in series with a 150K resistor 986 terminating at ground. The middle point, or junction of the voltage divider network located at the point of series connection, provides the optimal level of signal originating at Input 2 904. Signals originating at Input 2 are finally summed with signals that originate at Input 1 through a 320K resistor 989. The effect of this asymmetrical summing resistor network (982 and 989) working in conjunction with the preceding voltage divider network may substantially tame the sympathetic interactions between the two channels and deliver a rich tonal quality and dynamic feel that responds well to low and high output pickups and soft and aggressive playing techniques when employing one or the other, or both, amplifier channels.

Figure 27:
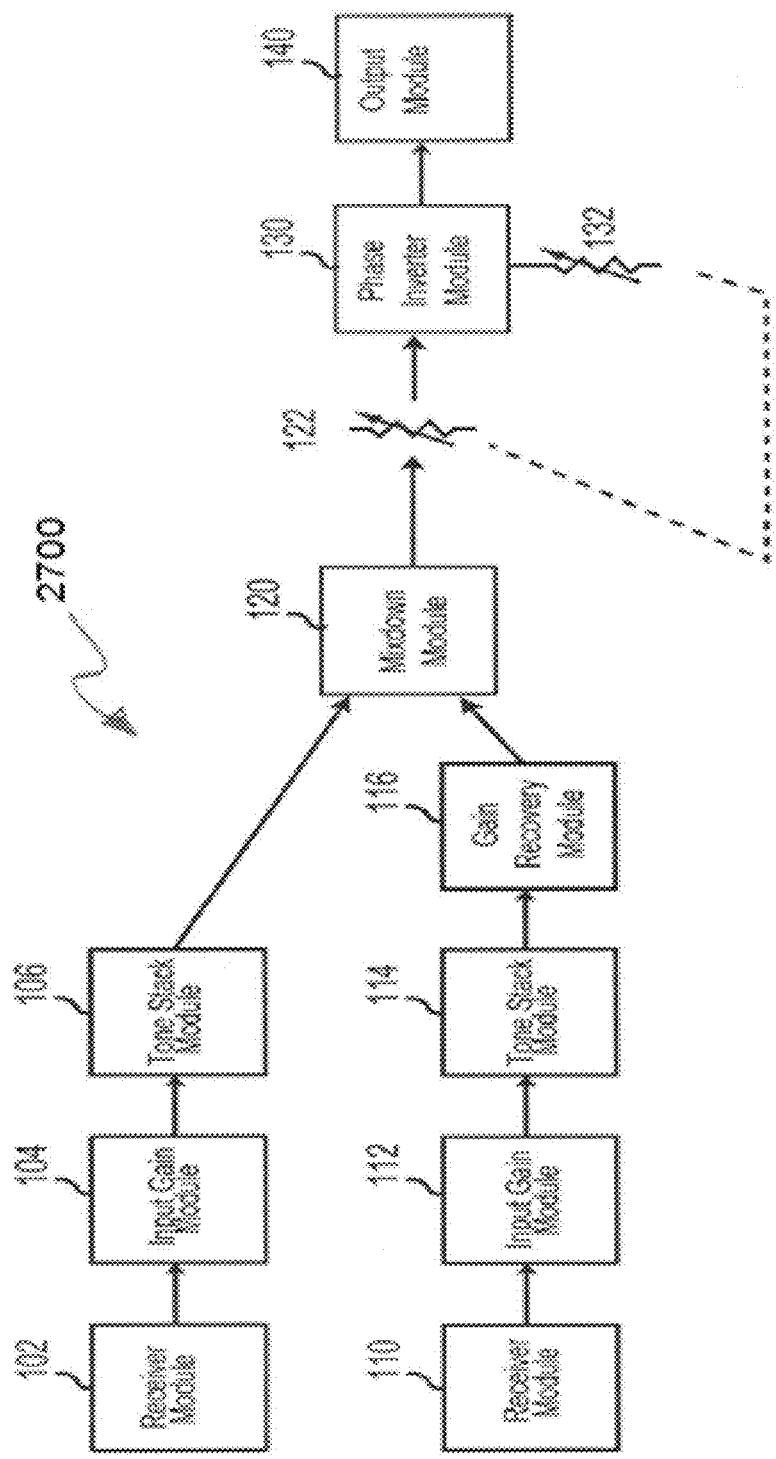
FIG. 27 is a block diagram of an embodiment of a guitar amplifier.

FIG. 27 shows the hybrid master guitar amplifier 2700 may utilize a dual-ganged potentiometer including variable resistors 122 and 132 to control audio signal levels as well as phase-inverter current limiting, control grid bias voltage and preamp circuitry operating voltages in a synchronized manner with a specifically chosen algorithm the governs the performance throughout the rotational operating range of the potentiometer. In one embodiment, the phase inverter circuit 130 is fed audio signals that have been prepared for further amplification in preamplifier circuitry that may include various gain stage modules, tone stack modules, gain recovery modules and mixdown modules 102-120.

Figure 28B:
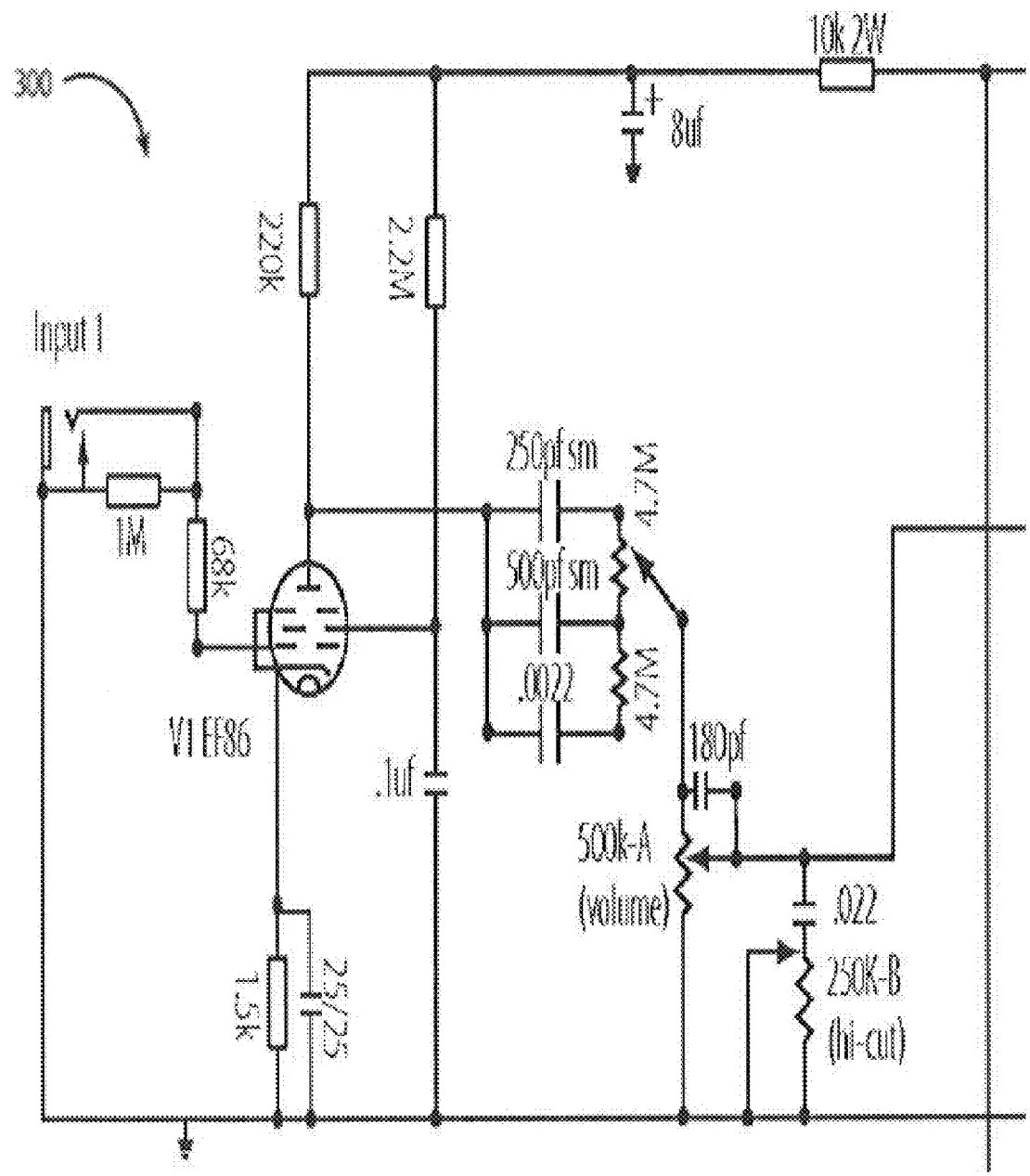
FIG. 28B is a detail of an embodiment of an instrument preamplifier module located in the upper left side of FIG. 28A.
Figure 28C:
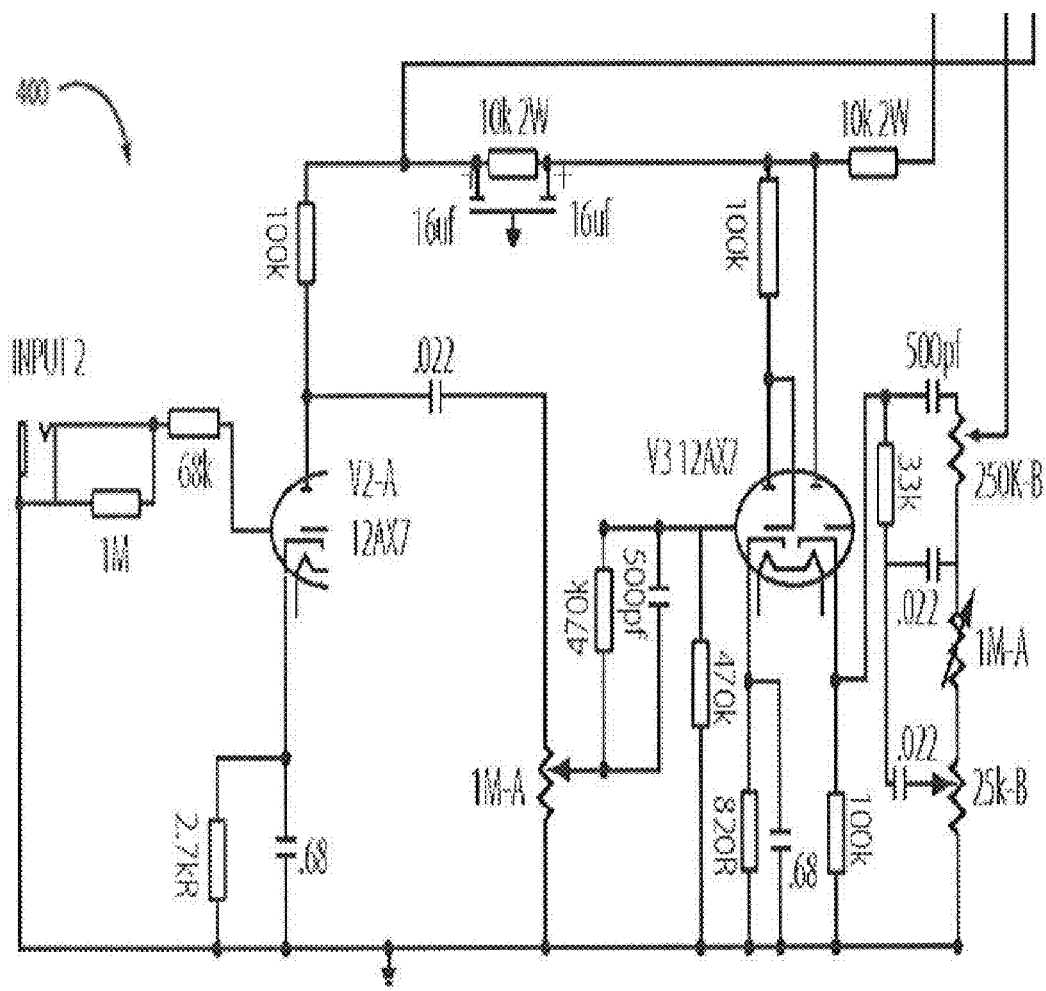
FIG. 28C is a detail of another embodiment of an instrument preamplifier module located in the lower left side of FIG. 28A.
Figure 28D:
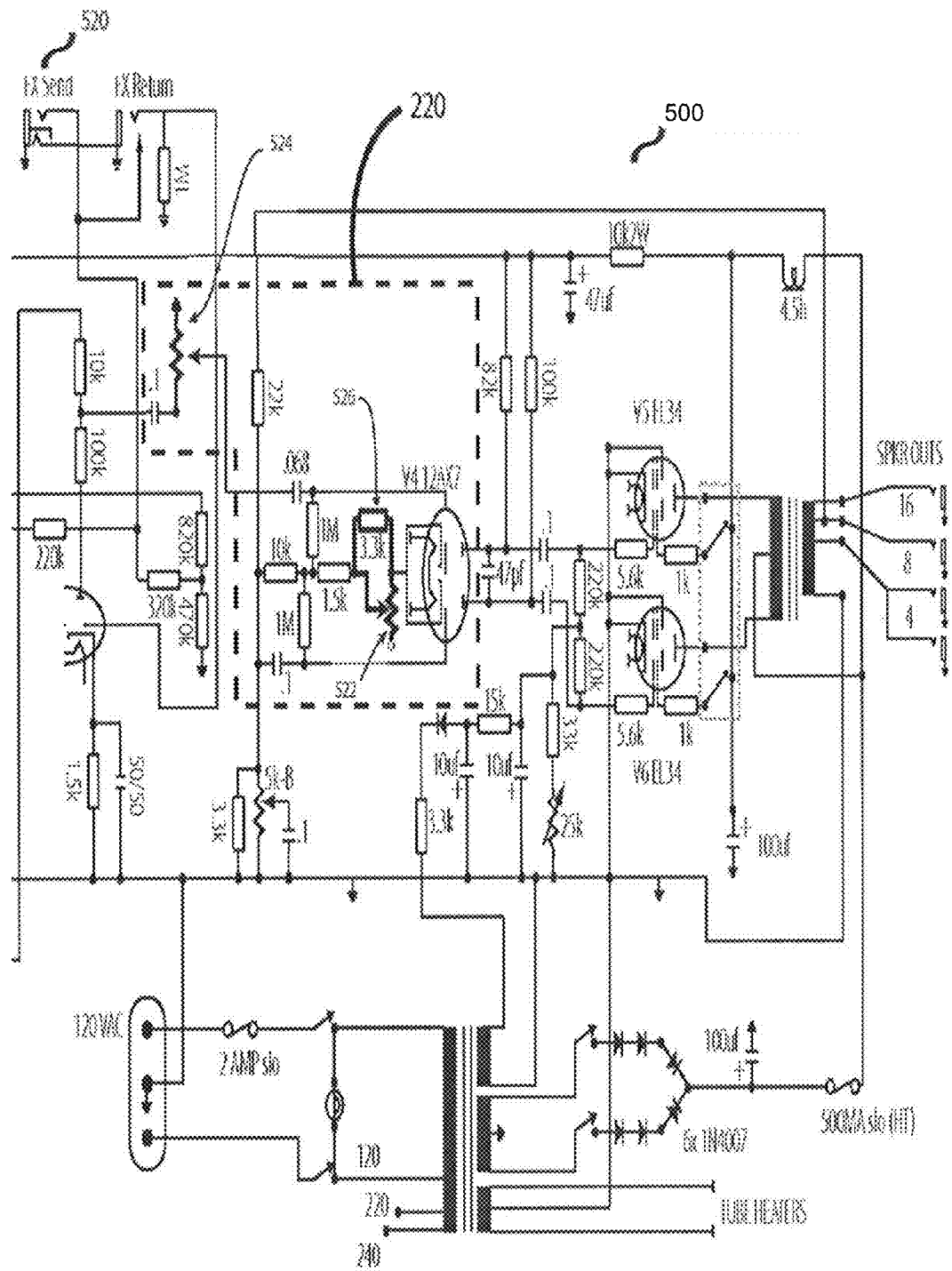
FIG. 28D is a detail of one embodiment of the hybrid master module and an example implementation in a phase-inverter module such as that shown on the right side of FIG. 28A.

FIG. 28A shows a schematic diagram of how FIG. 28B, FIG. 28C, and FIG. 28D, are interconnected with each other. FIG. 28A shows how the hybrid master technology is incorporated into the design of a tube guitar amplifier 200. Various embodiments may include a phase inverter tube module 220.

FIGS. 28B-D show an instrument preamp module that feeds audio signals into a phase inverter module. FIG. 28 B shows a first section of the schematic diagram; FIG. 28 C shows a second section of the schematic diagram; and FIG. 28 D shows a third section of the schematic diagram.

FIG. 28D shows one embodiment of a portion of the hybrid master guitar circuit 500 that includes a single element of the dual potentiometer, variable resistor 524, that may reduce the audio signal levels as a simple volume control that variably provides a shorting path to reference ground. The other element may be inserted as a variable resistor 522 in the cathode to ground path of the phase inverter "tail" portion of the circuit. Rotating the knob may increase resistance of this circuit and "limits" the amount of current that can flow through the phase inverter circuit thus reducing its operating effectiveness with the byproduct being a reduction in perceived audio signal. Additionally, by placing this variable resistor 522 electronically adjacent to the cathode terminal of the phase inverter triode tube at the "top of the tail" it is possible to not only regulate cathode current flow but also regulate the phase inverter triode tube control grid bias voltage. There is a sonically pleasing range of operation that when rotating the hybrid master system control counter-clockwise, an increase to the sensitivity and gain of the phase inverter triode tube operation occurs as a direct result of reducing the control grid bias voltage to a specific pre-determined range.

Figure 29A:
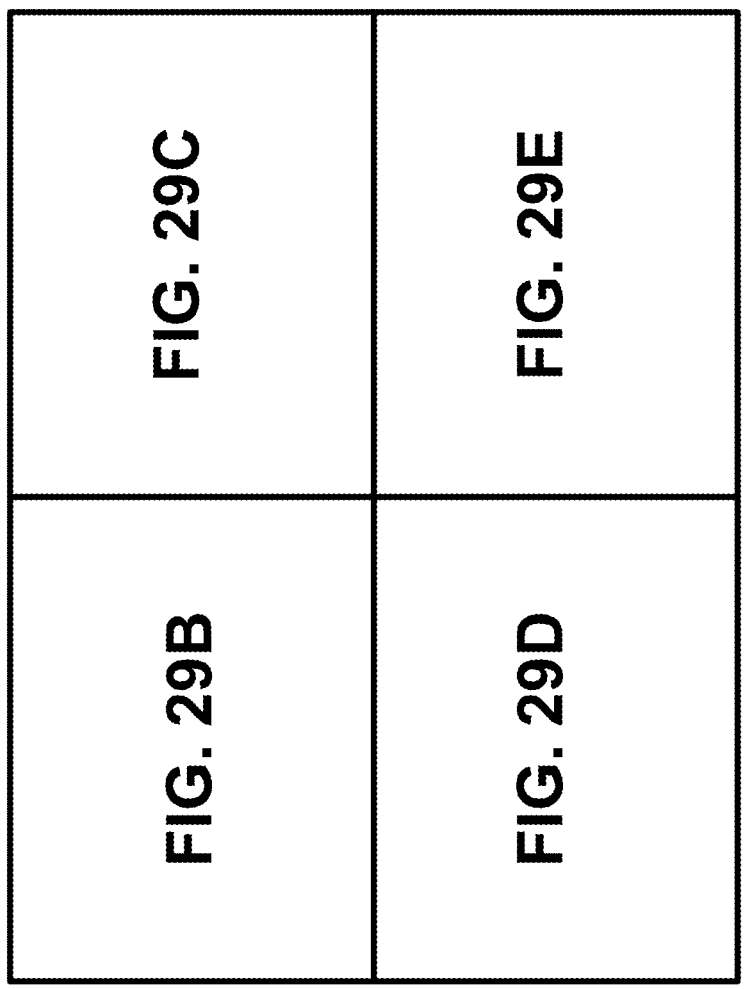
FIG. 29A-E shows a schematic diagram of an embodiment of an amplifier circuit with a venue switch to allow amplification selection without distortion.
Figure 29B:
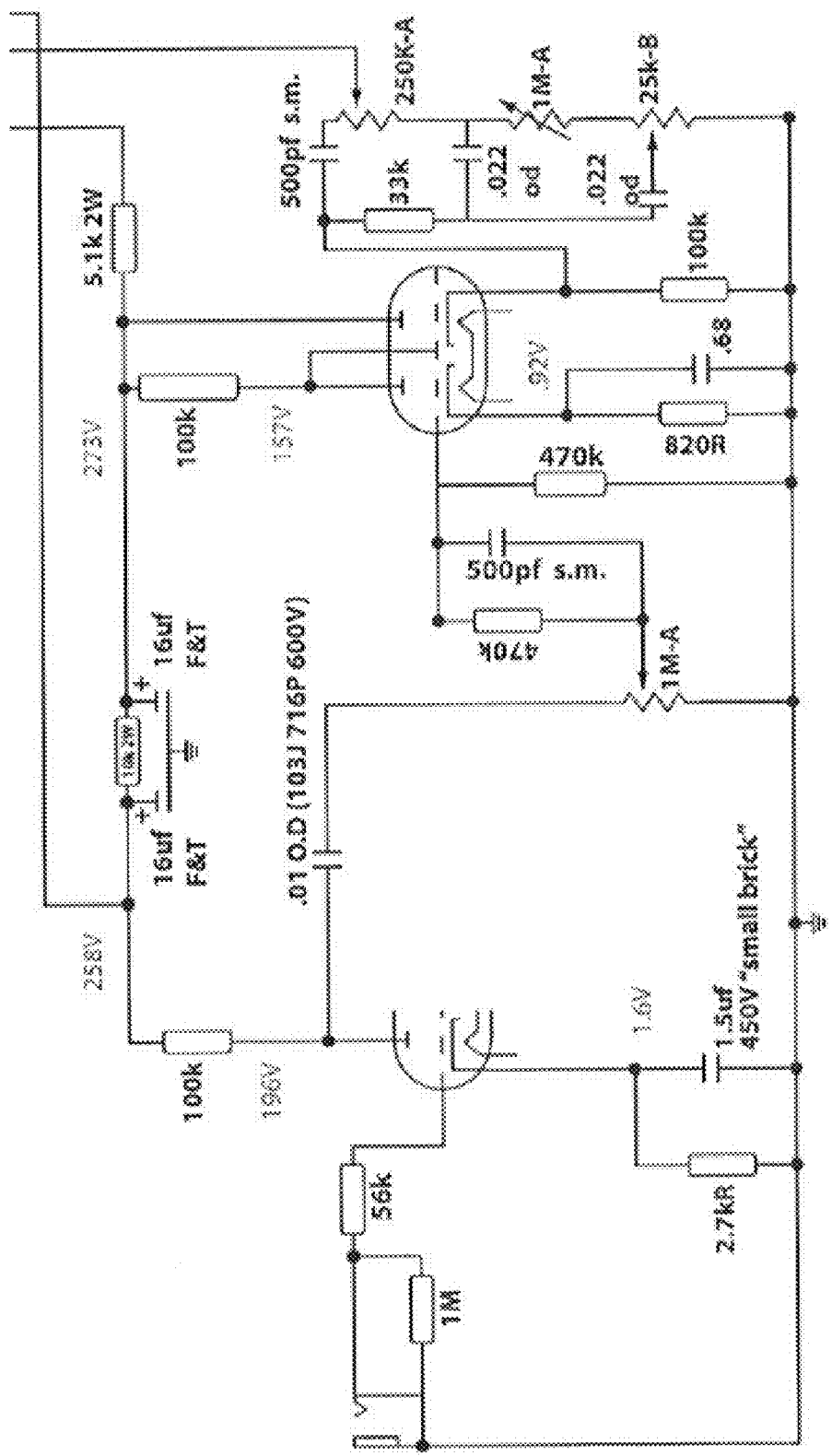
Figure 29C:
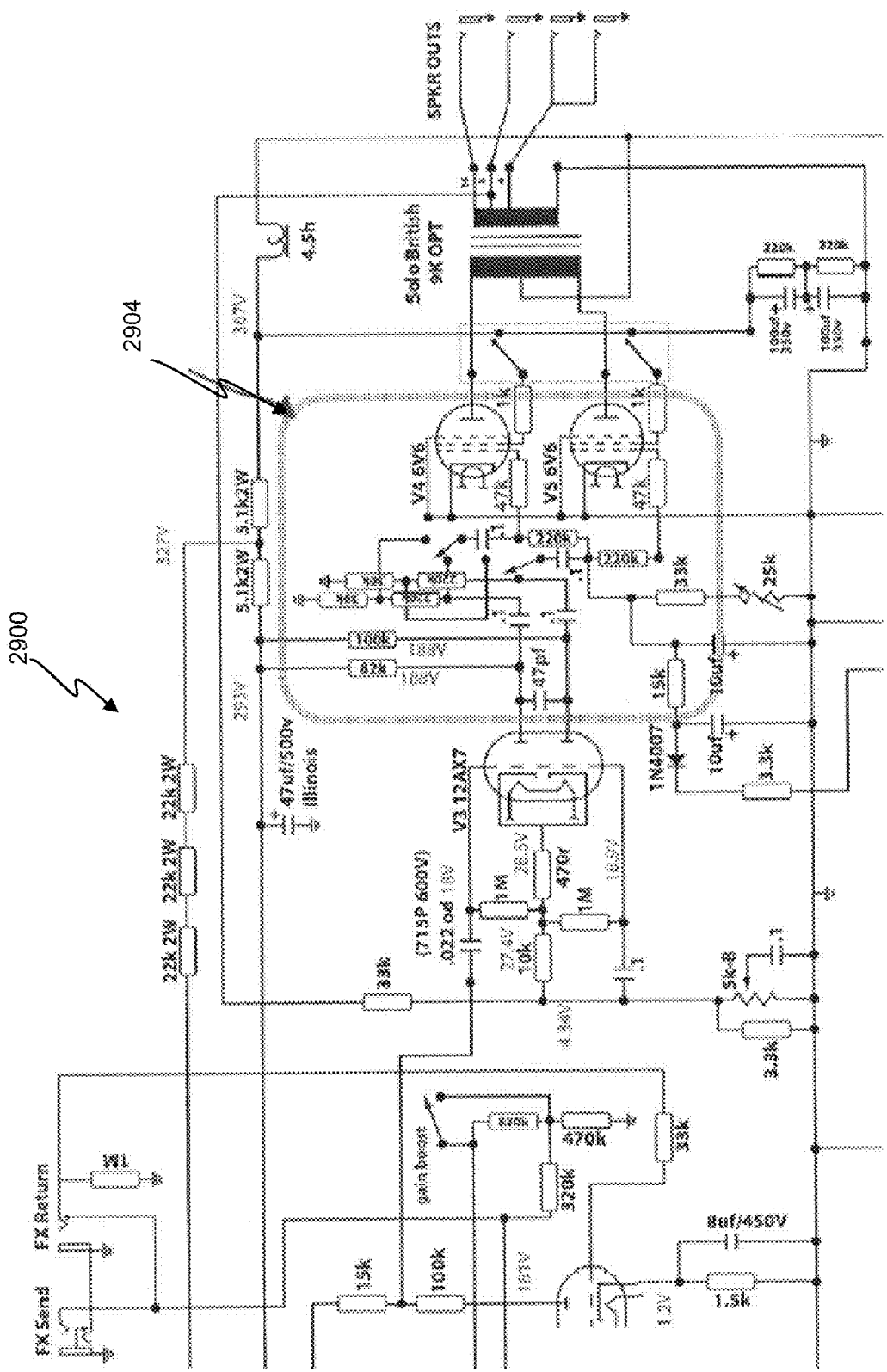
Figure 29D:
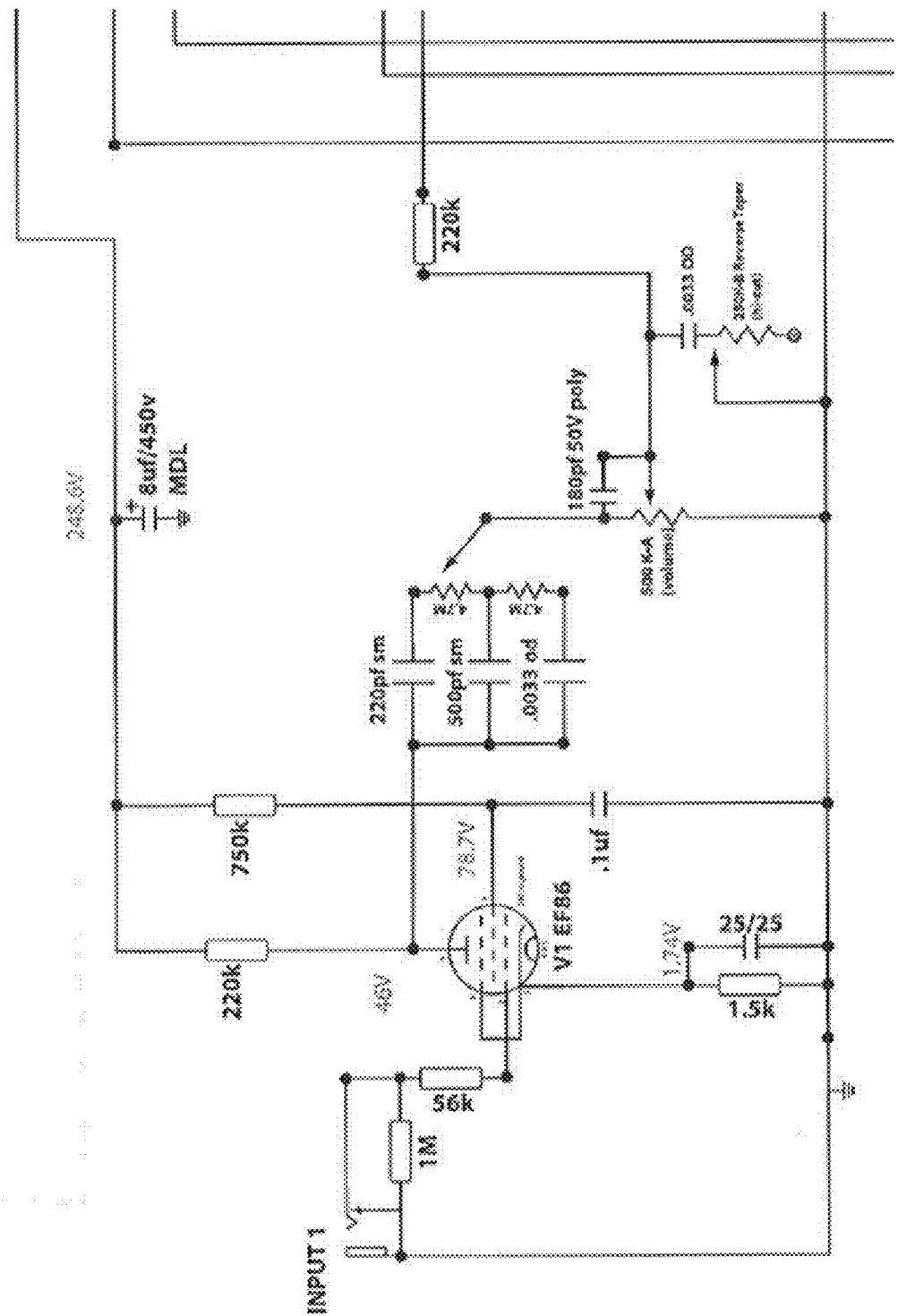
Figure 29E:
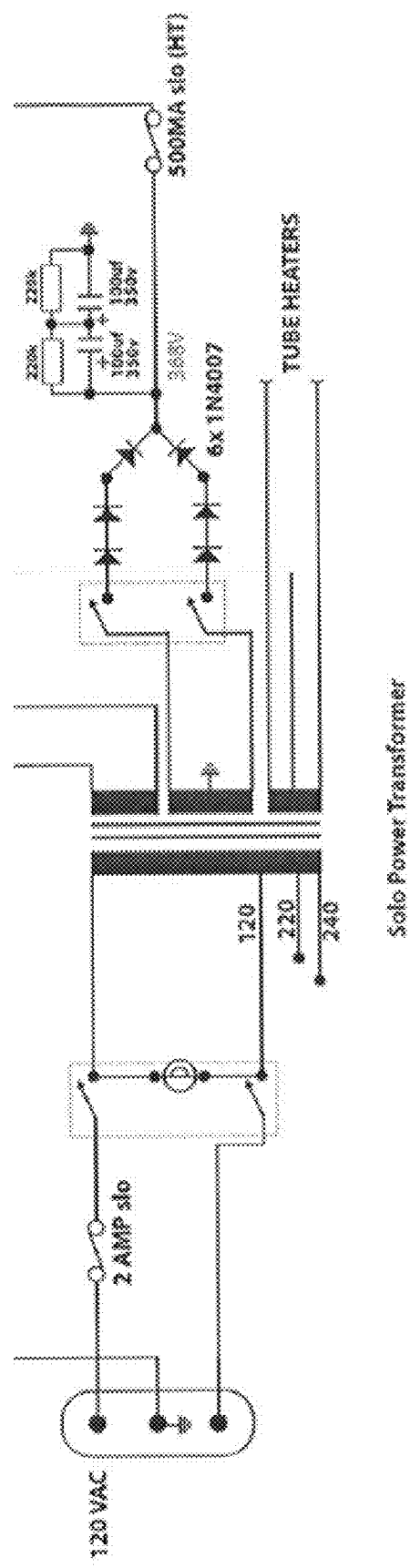

FIG. 29A shows how FIG. 29B, FIG. 29C, FIG. 29D, and FIG. 29E are interconnected with each other. FIG. 29A shows a schematic diagram of an amplifier circuit 2900 with a venue switch to allow amplification selection without distortion, with FIG. 29 B shows a first section of the schematic diagram, FIG. 29 C shows a second section of the schematic diagram, FIG. 29 D shows a third section of the schematic diagram, and FIG. 29 E shows a fourth section of the schematic diagram. The venue switch module 2904 attenuates the signal without distortion of the effects of the amplifier. The venue switch knocks down the amplification by a fixed amount, such as 50%, 60%, 75%, 80%, 90% or any other percentage. This fixed change in amplification is switch activated and not adjustable with a potentiometer. The volume control will change the output at the base line starting point set by the venue switch. For example, the low output of the venue switch could be in the range of 8 to 18 Watts or limited to 38 Watts in other embodiments.

In this embodiment, the venue switch executes a wholesale 80% reduction in volume while retaining the sound and feel of the amplifier while making the user interface as simple as a single toggle switch. The venue switch utilizes a dual-pole dual-throw (DPDT) toggle switch to select between a full resolution audio signal path and reduced level audio signal path. The audio level reduction circuitry is located at the insertion point located between the preamp and the power amp. More specifically, the circuitry is inserted after the plates of the phase inverter tube. In use, the phase inverter tube creates two signal paths that are out of phase with each other. Typically, these two signal paths feed forward to the power tube section to utilize pairs of tubes operating in an A/B amplification mode.

High voltages are decoupled from the audio signals of the two plates of the phase inverter tube with capacitors, such as Mallory 0.01 UF 600V type. This is the where the full resolution audio signal is derived in this embodiment. For reduced audio signals, a carefully designed resistor network has been designed into the venue switch module 2904 to achieve the desired level of reduction to the audio signals. Specifically, full resolution signals enter a voltage divider resistor network through a 220K resistor wired in series with a 33K resistor connected to signal ground reference. A DPDT toggle switch is connected to the audio signal input point of the power tubes. In the "up" position for the venue switch, the full resolution audio signals are fed forward to the power tubes. In the "down" position for the venue switch, the reduced resolution audio signals are fed forward to the power tubes.

The carefully designed voltage divider network has been chosen for the level of reduction in signal while retaining the full complement of harmonic overtones that the full resolution signal offers. When substitute values were used for the voltage divider network, the signals were predictably attenuated but with an undesired level of modification to the harmonic structure, perceived openness of the sound quality and feel. As designed, the venue switch circuitry delivers a high quality sound that is approximately the same as full resolution signals but at lower volume levels that meet the needs of today's guitarists.

Whether used alone or in conjunction with other means of volume level reduction, the venue switch performs with a mixture of volume reduction approaches including, pentode/triode power tube operation and our hybrid master. When engaged, the perceived volume reduction can be brought down to levels that could be considered "bedroom" volume levels (i.e., levels that could be considered appropriate for home use). In normal operation, an amplifier equipped with Venue Switch might offer perceived operating volume levels as follows:

Pentode Mode (full power 38 watts)
Triode Mode (half power 18 watts)
Pentode Mode with Venue Switch engaged (~8 watt sound levels)
Triode Mode with Venue Switch engaged (~4 watt sound levels)

When operated in conjunction with hybrid master, the guitarist has the ability to fine tune the actual perceived volume level.

Professional stage performance volume levels have dramatically lowered over the past 10 years. In particular, the stage volume requirements for modern houses of worship have significantly changed. In fact, the ideal stage volume for today's praise musician has been reduced to approximately the same level as those that would be considered appropriate for home use. For these reasons, the venue switch offers a superior performance for all musicians no matter where they choose to play, no matter what venue (stage, studio, church, club, pub, bedroom or arena), no matter what volume they choose to play, the full impact of wide range of guitar sounds remains intact, clean to mean (clear signals to heavily distorted signals) while retaining the full harmonic structure and sonic bloom of each note for this embodiment.

Thus, it should be understood that the embodiments and examples described herein have been chosen and described in order to best illustrate the principles of the invention and its practical applications to thereby enable one of ordinary skill in the art to best utilize the invention in various embodiments and with various modifications as are suited for particular uses contemplated. Even though specific embodiments of this invention have been described, they are not to be taken as exhaustive. There are several variations that will be apparent to those skilled in the art.

What is claimed is:

1. A guitar amplifier for boosting a signal from an electric guitar, comprising:
   an enclosure;
   an input for receiving the signal from the electric guitar;
   a pre-amp stage;
   a phase inverter stage;
   a power amp stage;
   a plurality of vacuum tubes used to process the signal, wherein each of the pre-amp stage, the phase inverter stage, and the power amp stage include the plurality of vacuum tubes to process the signal;
   a speaker output;
   a volume knob that adjusts amplitude of the signal for the speaker output; and
   a venue switch accessible to the user of the guitar amplifier, wherein:
      the venue switch has first position and a second position that changes amplitude of the signal after the pre-amp stage, whereby distortion of the pre-amp stage is preserved regardless of a position of the venue switch,
      the plurality of vacuum tubes process the signal in both the first position and the second position,
      in the first position the volume knob adjusts amplitude in a first range,
      in the second position the volume knob adjusts amplitude in a second range different from the first range,
      the first range has a first maximum amplitude,
      the second range has a second maximum amplitude, and
      the first maximum amplitude is less than half of the second maximum amplitude.

2. The guitar amplifier for boosting the signal from the electric guitar of claim 1, wherein the first maximum is no more than 20% of the second maximum.

3. The guitar amplifier for boosting the signal from the electric guitar of claim 1, wherein the venue switch is a dual-pole dual-throw (DPDT) toggle switch.

4. The guitar amplifier for boosting the signal from the electric guitar of claim 1, wherein the venue switch is directly coupled to a power tube.

5. The guitar amplifier for boosting the signal from the electric guitar of claim 1, wherein the venue switch selects different resistance configurations to change amplitude of the speaker output.

6. The guitar amplifier for boosting the signal from the electric guitar of claim 1, further comprising two tone stack modules are selectable by the user to select different sound processing for the guitar amplifier.

7. The guitar amplifier for boosting the signal from the electric guitar of claim 1, further comprising a speaker housed within the enclosure.

8. A guitar amplifier for processing a signal from a guitar, comprising:
   an enclosure;
   an input for receiving the signal from the electric guitar;
   a pre-amp stage;
   a phase inverter stage;
   a power amp stage;
   a plurality of vacuum tubes used to process the signal, wherein each of the pre-amp stage, the phase inverter stage, and the power amp stage include the plurality of vacuum tubes to process the signal;
   a speaker output;
   a volume knob that adjusts amplitude of the signal for the speaker output; and
   a venue switch accessible to the user of the guitar amplifier, wherein:
      the venue switch has first position and a second position that changes amplitude of the signal after the pre-amp stage, whereby distortion of the pre-amp stage is preserved regardless of a position of the venue switch,
      the plurality of vacuum tubes process the signal in both the first position and the second position,
      in the first position the volume knob adjusts power in a first range, in the second position the volume knob adjusts power in a second range different from the first range, the first range has a first maximum power greater than 30 Watts, and the second range has a second maximum power less than 20 Watts.

9. The guitar amplifier for processing the signal from the guitar of claim 8, wherein the second maximum power is less than 15 Watts, 10 Watts, and/or 8 Watts.

10. The guitar amplifier for processing the signal from the guitar of claim 8, wherein the first maximum power is greater than 35 Watts, 40 Watts, 45 Watts, and/or 50 Watts.

11. The guitar amplifier for processing the signal from the guitar of claim 8, wherein the venue switch is a dual-pole dual-throw (DPDT) toggle switch.

12. The guitar amplifier for processing the signal from the guitar of claim 8 wherein the venue switch is directly coupled to a power tube.

13. The guitar amplifier for processing the signal from the guitar of claim 8, wherein the venue switch selects different resistance configurations to change power of the speaker output.

14. The guitar amplifier for processing the signal from the guitar of claim 8, further comprising two tone stack modules are selectable by the user to select different sound processing for the guitar amplifier.

15. The guitar amplifier for processing the signal from the guitar of claim 8, further comprising a speaker housed within the enclosure.

16. The guitar amplifier for boosting the signal from the electric guitar of claim 1, wherein the venue switch is coupled to the phase inverter stage.

17. The guitar amplifier for boosting the signal from the electric guitar of claim 1, wherein vacuum tubes in the power amplifier stage process the signal regardless of position of the venue switch.

18. The guitar amplifier for processing the signal from the guitar of claim 8, wherein the venue switch is coupled to the phase inverter stage.

19. The guitar amplifier for processing the signal from the guitar of claim 8, wherein vacuum tubes in the power amplifier stage process the signal regardless of position of the venue switch.

20. The guitar amplifier for processing the signal from the guitar of claim 8, wherein the first maximum power is no more than 20% of the second maximum power.

* * * * *